United States Patent
Kim et al.

(10) Patent No.: US 10,401,557 B2
(45) Date of Patent: Sep. 3, 2019

(54) SEMICONDUCTOR LIGHT EMITTING DIODE CHIP AND LIGHT EMITTING DEVICE HAVING THE SAME

(71) Applicant: SAMSUNG ELECTRONICS CO., LTD., Suwon-si (KR)

(72) Inventors: Jong In Kim, Seoul (KR); Ho Young Song, Suwon-si (KR); Yong Il Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 423 days.

(21) Appl. No.: 15/078,488

(22) Filed: Mar. 23, 2016

(65) Prior Publication Data

US 2016/0349445 A1 Dec. 1, 2016

(30) Foreign Application Priority Data

May 29, 2015 (KR) .................. 10-2015-0076572

(51) Int. Cl.
*H01L 33/46* (2010.01)
*H01L 33/50* (2010.01)
(Continued)

(52) U.S. Cl.
CPC .......... *G02B 6/0073* (2013.01); *H01L 33/46* (2013.01); *H01L 33/56* (2013.01); *F21Y 2101/00* (2013.01);
(Continued)

(58) Field of Classification Search
CPC ........ G02B 6/0073; H01L 33/46; H01L 33/56
See application file for complete search history.

(56) References Cited

U.S. PATENT DOCUMENTS 6,015,719 A * 1/2000 Kish, Jr. ................ H01L 33/10
257/84
6,372,608 B1 4/2002 Shimoda et al.
(Continued)

FOREIGN PATENT DOCUMENTS

CN 101608743 A 12/2009
CN 103003966 A 3/2013
(Continued)

OTHER PUBLICATIONS

Communication dated Mar. 4, 2019 issued by the State Intellectual Property Office of P.R. China in counterpart Chinese Application No. 201610353596.2.

*Primary Examiner* — Shaun M Campbell
(74) *Attorney, Agent, or Firm* — Sughrue Mion, PLLC

(57) ABSTRACT

A semiconductor light emitting device includes a wiring board including a mounting surface on which a first wiring electrode and a second wiring electrode are disposed; a semiconductor light emitting diode (LED) chip including a first surface on which a first electrode and a second electrode are disposed, the first surface facing the mounting surface, the semiconductor LED chip further including a second surface positioned opposite to the first surface, and side surfaces positioned between the first and second surfaces, the first and second electrodes being connected to the first and second wiring electrodes, respectively; and a reflective layer disposed on at least one of the second surface and the side surfaces of the semiconductor LED chip.

17 Claims, 18 Drawing Sheets

(51) Int. Cl.
*H01L 33/56* (2010.01)
*H01L 33/62* (2010.01)
*F21V 8/00* (2006.01)
*F21Y 101/00* (2016.01)

(52) U.S. Cl.
CPC ............ *H01L 33/508* (2013.01); *H01L 33/62* (2013.01); *H01L 2224/16225* (2013.01)

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 3/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2006/0255358 A1* | 11/2006 | Shum | H01L 33/387 257/99 |
| 2007/0036189 A1* | 2/2007 | Hori | H01S 5/183 372/50.11 |
| 2007/0176196 A1 | 8/2007 | Kim et al. | |
| 2010/0084678 A1* | 4/2010 | Streubel | H01L 33/46 257/98 |
| 2011/0025183 A1 | 2/2011 | Su et al. | |
| 2011/0284822 A1* | 11/2011 | Jung | H01L 33/505 257/13 |
| 2012/0299040 A1* | 11/2012 | Kim | H01L 33/20 257/98 |
| 2013/0181247 A1 | 7/2013 | Jerebic et al. | |
| 2014/0001505 A1 | 1/2014 | Chang et al. | |
| 2014/0231852 A1 | 8/2014 | Suh et al. | |
| 2015/0062905 A1 | 3/2015 | Huang | |
| 2015/0085527 A1* | 3/2015 | Nam | H01L 33/60 362/612 |
| 2016/0240744 A1* | 8/2016 | Huang | H01L 33/62 |
| 2017/0103972 A1* | 4/2017 | Yamada | H01L 33/62 |

FOREIGN PATENT DOCUMENTS

| | | |
|---|---|---|
| CN | 103026513 A | 4/2013 |
| CN | 103119735 A | 5/2013 |
| CN | 104515040 A | 4/2015 |
| JP | 2007-251043 A | 9/2007 |
| KR | 10-2009-0039932 A | 4/2009 |
| KR | 10-2013-0074071 A | 7/2013 |
| KR | 10-2014-0121507 A | 10/2014 |

* cited by examiner

SEMICONDUCTOR LIGHT EMITTING DIODE CHIP AND LIGHT EMITTING DEVICE HAVING THE SAME

CROSS-REFERENCE TO RELATED APPLICATION

This application claims priority from Korean Patent Application No. 10-2015-0076572, filed on May 29, 2015, in the Korean Intellectual Property Office, the disclosure of which is incorporated herein in its entirety by reference.

BACKGROUND

Devices and apparatuses consistent with exemplary embodiments relate to a semiconductor light emitting device.

A semiconductor light emitting device such as a light emitting diode (LED) is a device which includes light-emitting material in which energy generated through electron-hole recombination in semiconductor junction parts is converted into light to be emitted therefrom. LEDs are commonly employed as light sources in lighting devices, large liquid crystal displays (LCDs), and backlight units, and the development of LEDs has been accelerated.

However, semiconductor LEDs have shortcomings in that the semiconductor LEDs are similar to point sources (that is, light emission surfaces thereof are very narrow). Thus, when the semiconductor LEDs are used as light sources of lighting devices or backlight units for displays, a separate optical structure may be needed to evenly spread light throughout a wide area. For example, a direct type backlight unit for a display may use a lens that expands light distribution and a diffusion sheet. Such an additional optical structure increases manufacturing costs and/or defect rates due to the requirement of assembling various structures. In particular, a thickness of a display panel may be disadvantageously increased.

SUMMARY

One or more exemplary embodiments provide a semiconductor light emitting diode (LED) chip in which light distribution is controlled at a chip level while securing substantially uniform light quality, and a light emitting device including the same.

According to an aspect of an exemplary embodiment, provided is a semiconductor light emitting device including: a wiring board including a mounting surface on which a first wiring electrode and a second wiring electrode are disposed; a semiconductor light emitting diode (LED) chip including a first surface on which a first electrode and a second electrode are disposed, the first surface facing the mounting surface, the semiconductor LED chip further including a second surface positioned opposite to the first surface, and side surfaces positioned between the first and second surfaces, the first and second electrodes being connected to the first and second wiring electrodes, respectively; and a reflective layer disposed on at least one of the second surface and the side surfaces of the semiconductor LED chip.

The reflective layer may include a distributed Bragg reflector (DBR) layer.

Transmissivity of light emitted from the semiconductor LED chip and passing through the DBR layer may be greater at a second incident angle than at a first incident angle, the second incident angle being greater than the first incident angle.

The reflective layer may be disposed on at least the second surface of the semiconductor LED chip, and an amount of light emitted from the DBR layer in a first region, which is defined based on a first rotation angle around a central axis, the central axis being perpendicular to the second surface of the semiconductor LED chip, and a second rotation angle greater than the first rotation angle, may be greater than the amount of light emitted from the DBR layer in a second region, which is defined based on the central axis and the first rotation angle.

The first rotation angle may range from about 30° to about 50°, and the second rotation angle ranges from about 70° to about 90°.

The semiconductor light emitting device may further include a lateral reflective portion disposed on the wiring board such that the lateral reflective portion surrounds the side surfaces of the semiconductor LED chip, the lateral reflective portion including a reflective material.

The reflective layer may include a metal.

The reflective layer may include at least one hole through which light is emitted from the semiconductor LED chip.

The semiconductor LED chip may include a light-transmissive substrate, a first conductivity-type semiconductor layer, an active layer, and a second conductivity-type semiconductor layer, the first conductivity-type semiconductor layer, the active layer, and the second conductivity-type semiconductor layer being sequentially stacked on the light-transmissive substrate, and the second surface of the semiconductor LED chip may be provided by the light-transmissive substrate.

According to an aspect of another exemplary embodiment, provided is a semiconductor light emitting device including: a wiring board including a mounting surface on which a first wiring electrode and a second wiring electrode are disposed; a semiconductor light emitting diode (LED) chip including a first surface on which a first electrode and a second electrode are disposed, the first surface facing the mounting surface, the semiconductor LED chip further including a second surface positioned opposite to the first surface, and side surfaces positioned between the first and second surfaces, the first and second electrodes being connected to the first and second wiring electrodes, respectively; and a light distribution adjustment layer disposed on the second surface of the semiconductor LED chip, wherein transmissivity of light emitted from the semiconductor LED chip and passing through the light distribution adjustment layer is greater at a second incident angle than at a first incident angle, the second incident angle being greater than the first incident angle.

The light distribution adjustment layer may have a structure in which dielectric films having different refractive indices are alternately stacked a plurality of times.

The light distribution adjustment layer may extend to the side surfaces of the semiconductor LED chip.

The semiconductor light emitting device may further include a wavelength conversion layer disposed between the light distribution adjustment layer and the semiconductor LED chip and configured to convert at least a portion of light emitted from the semiconductor LED chip into light having a different wavelength.

According to an aspect of still another exemplary embodiment, provided is a semiconductor light emitting diode (LED) chip including a first surface on which first and second electrodes are disposed, a second surface positioned opposite to the first surface, and side surfaces positioned between the first and second surfaces, the semiconductor LED chip further including: a light distribution adjustment layer disposed on at least the second surface of the semiconductor LED chip, wherein transmissivity of light emitted from the semiconductor LED chip and passing through the light distribution adjustment layer is greater at a second incident angle than at a first incident angle, the second incident angle being greater than the first incident angle.

According to an aspect of still another exemplary embodiment, provided is a display device including: an image display panel configured to display an image; a backlight unit disposed below the image display panel and including the semiconductor light emitting device of claim 1; and a light guide plate configured to guide light emitted from the backlight unit toward the image display panel.

According to an aspect of still another exemplary embodiment, provided is a semiconductor light emitting device including: a wiring board; a semiconductor light emitting diode (LED) chip mounted on the wiring board and configured to emit light; and a light distribution adjustment layer disposed on at least a portion of a surface of the semiconductor LED chip, wherein transmissivity of light, which is emitted from the semiconductor LED chip and passes through the light distribution adjustment layer, is adjusted according to an incident angle of the light on the light distribution adjustment layer.

The transmissivity of the light may be adjusted such that, with respect to the light distribution adjustment layer, transmissivity of the light traveling in a vertical direction is lowered and transmissivity of the light traveling in a lateral direction is increased.

The light distribution adjustment layer may have a structure in which dielectric films having different refractive indices are alternately stacked a plurality of times, and the transmissivity of the light may be further adjusted according to at least one of the refractive indices, thicknesses, and a number of stacking of the respective dielectric films included in the light distribution adjustment layer.

The light distribution adjustment layer may be disposed on at least one of an upper surface and a side surface of the semiconductor LED chip.

The reflective layer may include at least one of a distributed Bragg reflector (DBR) layer and a metal reflective layer.

BRIEF DESCRIPTION OF DRAWINGS

The above and/or other aspects will be more apparent by describing certain example embodiments with reference to the accompanying drawings in which.

DETAILED DESCRIPTION

Figure 1:
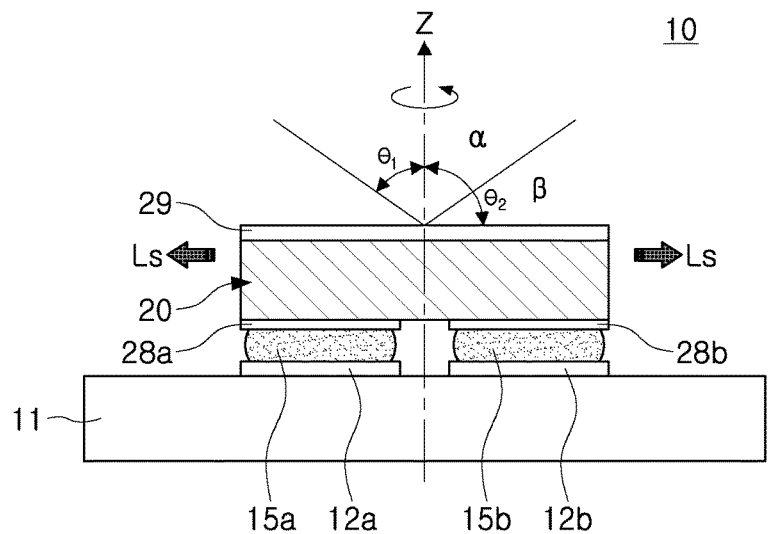
FIG. 1 is a side cross-sectional view illustrating a semiconductor light emitting device according to an exemplary embodiment.

Hereinafter, exemplary embodiments will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. These embodiments are provided so that this disclosure will be thorough and complete, and will fully convey the scope of the invention to those skilled in the art. In the drawings, the shapes and dimensions may be exaggerated for clarity. Thus, in the drawings, the shapes and dimensions of elements may be exaggerated for clarity, and the same reference numerals will be used throughout to designate the same or like elements.

In this disclosure, terms such as "above", "upper portion", "upper surface", "below", "lower portion", "lower surface", "lateral surface", and the like, are determined based on the drawings, and in actuality, the terms may be changed according to a direction in which a device or an element is disposed.

The expression "an exemplary embodiment or one example" used in the present disclosure does not refer to identical examples and is provided to stress different unique features between each of the examples. However, examples provided in the following description are not excluded from being associated with features of other examples and implemented thereafter. For example, even if matters described in a specific example are not described in a different example thereto, the matters may be understood as being related to the other example, unless otherwise mentioned in descriptions thereof.

FIG. 1 is a side cross-sectional view illustrating a semiconductor light emitting device according to an exemplary embodiment.

Referring to FIG. 1, a semiconductor light emitting device 10 includes a wiring board 11 having a mounting surface and a semiconductor light emitting diode (LED) chip 20 mounted on or above the mounting surface of the wiring board 11.

The wiring board 11 may include a package board including first and second wiring electrodes 12a and 12b mounted on the mounting surface. The first and second wiring electrodes 12a and 12b may extend to a lower surface or a side surface of the wiring board 11. The first and second wiring electrodes 12a and 12b may include a metal such as silver (Au), copper (Cu), gold (Ag), or aluminum (Al). The wiring board 11 may include an insulating resin board, a ceramic board, or a metal board. For example, the wiring board 11 may be a printed circuit board (PCB), a metal core printed circuit board (MOPCB), a metal printed circuit board (MPCB), or a flexible printed circuit board (FPCB). In an exemplary embodiment, the wiring board 11 may include a board coated with a highly reflective material such as silver (Ag).

The semiconductor LED chip 20 may have a first surface on which first and second electrodes 28a and 28b are disposed, a second surface positioned to oppose the first surface, and side surfaces positioned between the first and second surfaces. The semiconductor LED chip 20 may be mounted in such a manner that the first surface thereof faces the mounting surface of the wiring board 11, and the first and second electrodes 28a and 28b may be connected to the first and second wiring electrodes 12a and 12b of the wiring board 11 through solder balls 15a and 15b, respectively.

In the above mounting structure, the second surface of the semiconductor LED chip 20 may be provided as a main light emission surface. A reflective layer 29 may be disposed as a light distribution adjustment layer on the second surface of the semiconductor LED chip 20.

The reflective layer 29 according to an exemplary embodiment may include a distributed Bragg reflector (DBR) layer. The reflective layer 29 may serve to adjust light distribution by reflecting light traveling in a direction perpendicular to the second surface (in this sense, the reflective layer may be also referred to as a "light distribution adjustment layer" in the present disclosure). In particular, when the reflective layer 29 is a DBR layer in an exemplary embodiment, the reflective layer 29 may serve as a band-pass filter (BPF) to restrain transmission of light having a specific wavelength, and causes transmissivity of light to be varied according to incident angles thereof, the reflective layer 29 may effectively adjust light distribution.

In detail, as illustrated in FIG. 1, in the reflective layer 29 which is a DBR layer, transmission of light is restrained in a first region α ($0 \leq \alpha \theta 1$) defined based on a central axis (Z) perpendicular to the second surface of the chip 20 and a first rotation angle θ1, whereas a relatively large amount of light may be transmitted in a second region β (θ1<βθ2) defined based on the first rotation angle θ1 and a second rotation angle θ2 greater than the first rotation angle θ1. As a result, in the reflective layer 29, light emitted from the second region β may be increased relative to the first region α closer to the central axis Z, and thus light distribution may have a batwing shape.

Final light distribution may be determined by combining light emitted from the reflective layer 29 and light Ls emitted from the sides of the semiconductor LED chip 20. The laterally emitted light Ls reinforces an amount of light of a region (for example, a region closer to ±90° of the central axis Z) away from the central axis Z, rather than a region closer to the central axis Z, in the light distribution, and thus, light distribution having a batwing shape may be maintained to provide uniform light emission distribution.

In this manner, by wholly or partially replacing a function of an optical structure such as a lens with the reflective layer 29, light distribution may be effectively adjusted at the chip level, and a need for an additional optical structure may be obviated.

Figure 2:
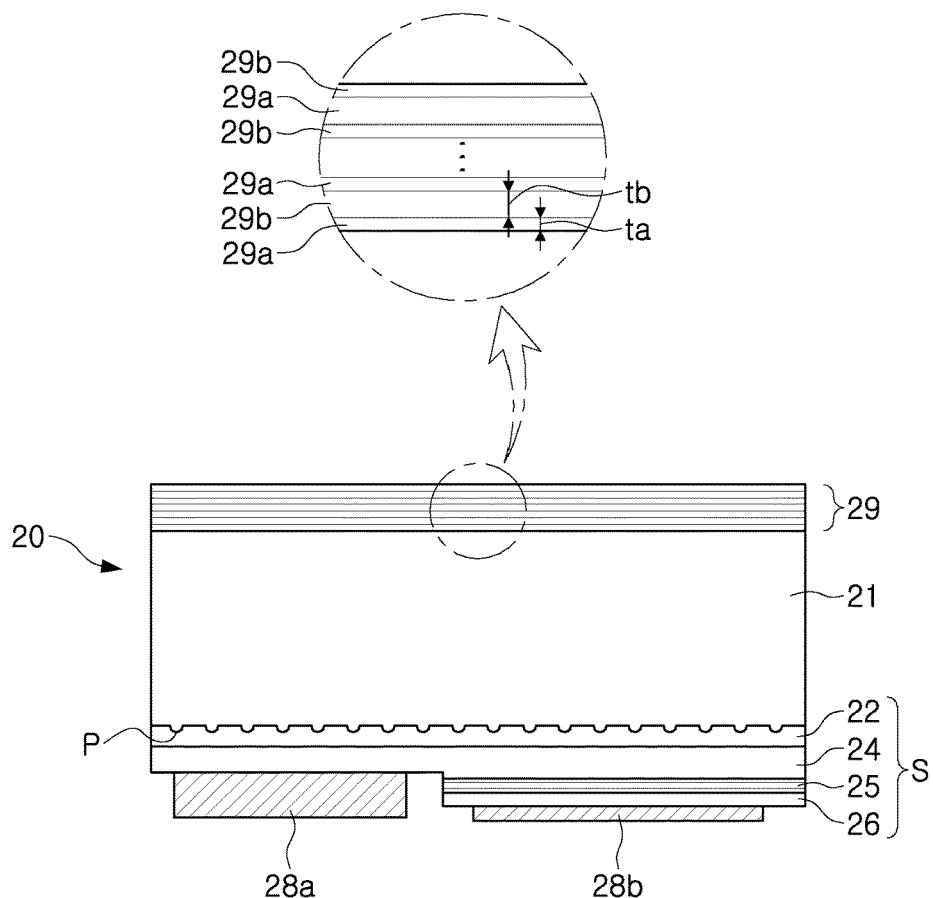
FIG. 2 is a side cross-sectional view illustrating a semiconductor light emitting device employing the semiconductor light emitting diode (LED) chip illustrated in FIG. 1.

FIG. 2 is a side cross-sectional view illustrating a semiconductor light emitting diode (LED) chip that may be employed in the semiconductor light emitting device of FIG. 1.

A semiconductor LED chip illustrated in FIG. 2 may include a light-transmissive substrate 21, a semiconductor stacked body S, and a light distribution adjustment layer 29.

The light-transmissive substrate 21 includes a second surface of a chip, which provides a main light extraction surface. The light-transmissive substrate 21 may be an insulating substrate such as a sapphire substrate. However, the substrate is not limited thereto. That is, in addition to the insulating substrate, the substrate 21 may be a conductive or semiconductor substrate which guarantees light transmittance. An irregular pattern P may be formed on a lower surface, which provides a crystal growing plane, of the substrate 21. The irregular pattern P may improve light extraction efficiency and enhance quality of a grown single crystal.

The semiconductor stacked body S may include a first conductivity-type semiconductor layer 24, an active layer 25, and a second conductivity-type semiconductor layer 26 sequentially disposed on the light-transmissive substrate 21. A buffer layer 22 may be disposed between the light-transmissive substrate 21 and the first conductivity-type semiconductor layer 24.

The buffer layer 22 may include $In_xAl_yGa_{1-x-y}N$, where $0 \leq x \leq 1$ and $0 \leq y \leq 1$. For example, the buffer layer 22 may include GaN, AlN, AlGaN, or InGaN. For example, the buffer layer 22 may be provided by combining a plurality of layers or by gradually changing a composition thereof.

The first conductivity-type semiconductor layer 24 may be a nitride semiconductor layer including an n-type $In_xAl_yGa_{1-x-y}N$, where $0 \leq x \leq 1$, $0 \leq y \leq 1$, and $0 \leq x+y < 1$, and an n-type impurity may be silicon (Si). For example, the first conductivity-type semiconductor layer 24 may include an n-type GaN. The second conductivity-type semiconductor layer 26 may be a nitride semiconductor layer including a p-type $In_xAl_yGa_{1-x-y}N$, where $0 \leq x \leq 1$, $0 \leq y < 1$, and $0 \leq x+y < 1$, and a p-type impurity may be magnesium (Mg). For example, the second conductivity-type semiconductor layer 26 may have a monolayer structure, or may have a multilayer structure including layers having different compositions according to an exemplary embodiment. The active layer 25 may have a multi-quantum well (MQW) structure in which quantum well layers and quantum barrier layers are alternately stacked. For example, the quantum well layers and the quantum barrier layers may be $In_xAl_yGa_{1-x-y}N$, where $0 \le x \le 1$, $0 \le y \le 1$, and $0 < x+y \le 1$ having different compositions. For example, the quantum well layers may be $In_xGa_{1-x}N$, where $0 < x \le 1$, and the quantum barrier layers may be GaN or AlGaN. The active layer 25 is not limited to the MQW structure and may have a single quantum well (SQW) structure.

First and second electrodes 28a and 28b may be disposed in a mesa-etched region of the first conductivity-type semiconductor layer 24 and in the second conductivity-type semiconductor layer 26, respectively, and the first and second electrodes 28a and 28b are positioned to provide the same surface (a first surface of the chip). The first electrode 28a may include a reflective metal. For example, the first electrode 28a may include a material such as silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), or gold (Au), and may have a monolayer or may have a structure including two or more layers. The second electrode 28b may include at least one of aluminum (Al), gold (Au), chromium (Cr), nickel (Ni), titanium (Ti), and tin (Sn).

As illustrated in FIG. 2, the reflective layer 29, a light distribution adjustment layer (or a DBR layer) may have a structure in which two types of dielectric films 29a and 29b having different refractive indices are alternately stacked a plurality of times. As mentioned above, the DBR reflective layer 29 may have different transmissivity according to incident angles of light having a specific wavelength. For example, in the reflective layer 29, transmissivity of the reflective layer 29 with respect to light emitted from the semiconductor LED chip 20 may be greater at a second incident angle than at a first incident angle, when the second incident angle is greater than the first incident angle. Details thereof will be described hereinafter with reference to FIGS. 5 through 7.

In the DBR structure employed in the present exemplary embodiment, variations in the transmissivity according to wavelengths of light (or wavelengths of the chip) as a target to be adjusted and the incident angles may be determined by selecting refractive indices, thicknesses to and tb, and a number of stacking of the respective films 29a and 29b constituting the DBR reflective layer.

The DBR layer 29 may be formed by repeatedly stacking the dielectric films 29a and 29b having different refractive indices at least twice to tens of times. To secure transmissivity according to incident angles, the DBR layer 29 may be designed to have a stacking number smaller than that of a general DBR structure and have a thickness reduced than that of the general DBR structure. For example, the DBR layer 29 may be formed by repeatedly stacking dielectric films three to fifty times, or preferably but not necessarily, may be formed by repeatedly stacking dielectric films four to thirty times. The DBR layer 29 may be designed to have a thickness of 1.5 µm or less and preferably, but not necessarily, 1 µm or less.

The dielectric films 29a and 29b constituting the DBR layer 29 may be selected from among an oxide or a nitride such as $SiO_2$, SiN, $SiO_xN_y$, $TiO_2$, $Si_3N_4$, $Al_2O_3$, TiN, AlN, $ZrO_2$, TiAlN, or TiSiN. When a wavelength of light generated by the active layer 25 is λ and n is a refractive index of the corresponding layer, the first and second dielectric layers 29a and 29b may have a thickness of λ/4 n. For example, refractive indices of the first and second dielectric layers 29a and 29b may be selected from within a range of about 1.4 to about 2.5, and when a light emission wavelength of a general LED chip is considered, a thickness of the first and second dielectric films 29a and 29b may be determined within a range of about 100 Å to 900 Å. The DBR layer 29 may be designed in such a manner that, with respect to a wavelength of light generated by the active layer 25, reflectivity of light traveling in a direction perpendicular to the light emission surface is relatively high (for example, 90% or greater).

In the present exemplary embodiment, the reflective layer 29 is illustrated and described as the DBR layer, but the reflective layer 29 is not limited thereto, and may have another reflective structure. For example, the reflective layer in an exemplary embodiment may be a metal reflective layer including a metal (refer to FIGS. 13A and 13B).

In this manner, the reflective layer (or a light distribution adjustment layer) employed in the main light extraction surface at a chip level may substitute an additional optical element required for adjusting light distribution in the related art. The semiconductor LED chip to which the foregoing reflective layer is applicable is not limited to the structure illustrated in FIG. 2, and may also be advantageously applied to chips having various structures. Also, to adjust light distribution, a position of the reflective layer may be variously modified.

FIGS. 3A through 3D are side cross-sectional views illustrating various semiconductor LED chips according to exemplary embodiments.

Figure 3A:
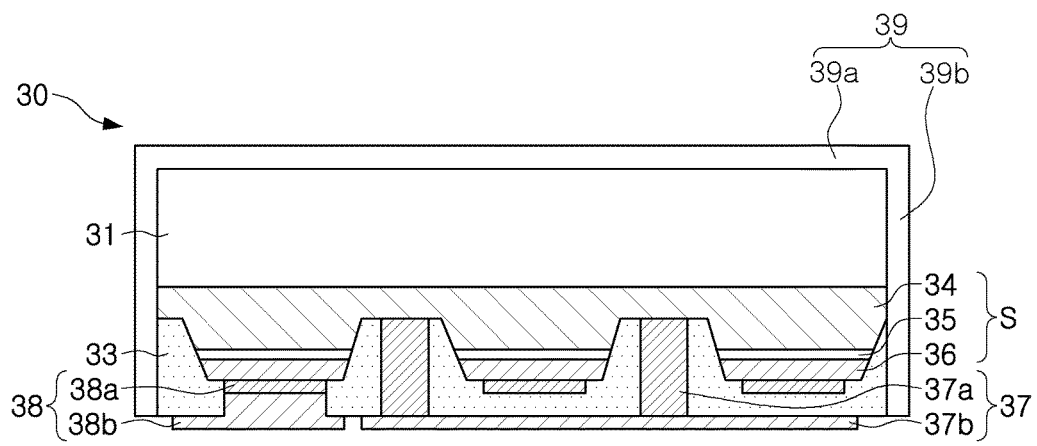
FIGS. 3A through 3D are side cross-sectional views illustrating various semiconductor LED chips according to exemplary embodiments.

Referring to FIG. 3A, a semiconductor LED chip 30 includes a semiconductor stacked body S disposed on one surface of a light-transmissive substrate 31. The semiconductor stacked body S may include a first conductivity-type semiconductor layer 34, an active layer 35, and a second conductivity-type semiconductor layer 36.

The light distribution adjustment layer 39 according to an exemplary embodiment may extend from another surface of the light-transmissive substrate 31, that is, the main light emitting surface, to a side surface. As illustrated in FIG. 3A, the light distribution adjustment layer 39 includes an upper region 39a positioned on the light emitting surface of the semiconductor LED chip 30 and a side region 39b positioned on the side surface of the chip 30. It is shown that the side region 39b is formed on the entire side surface of the chip 30. However, the side region 39b may be formed only on a partial region of the side surface of the chip 30. In this manner, the light distribution adjustment layer 39 according to an exemplary embodiment may adjust light distribution of light emitted from the side surface of the chip 30, as well as light distribution of light traveling in a direction perpendicular to the second surface.

In a case in which the light distribution adjustment layer 39 is a DBR layer, the light distribution adjustment layer 39 may be designed to generate a difference in transmissivity according to an incident angle to adjust light distribution, as described in the previous exemplary embodiment. Alternatively, the light distribution adjustment layer 39 may partially be a metal reflective layer. For example, only the upper region 39a may be formed as a metal reflective layer to suppress light extracted from the upper surface of the chip 30 and induce light to be extracted from the side surface of the chip 30, that is, from the side region 39b, thereby adjusting light distribution. As a result, the light distribution adjustment layer 39 may relatively increase light emitted from a region away from a central axis perpendicular to the upper surface of the light-transmissive substrate 31, rather than a region closer to the central axis, and may provide light distribution having a batwing shape in which lateral light distribution is strengthened, compared to the previous exemplary embodiment (refer to FIGS. 8, 9A, 9B, 11A, and 11B).

The semiconductor LED chip 30 includes first and second electrodes 37 and 38 respectively connected to the first and second conductivity-type semiconductor layers 34 and 36. The first electrode 37 may include a connection electrode portion 37a such as a conductive via connected to the first conductivity-type semiconductor layer 34 through the second conductivity-type semiconductor layer 36 and the active layer 35, and a first electrode pad 37b connected to the connection electrode portion 37a.

The connection electrode portion 37a is surrounded by an insulating portion 33 to be electrically separated from the active layer 35 and the second conductivity-type semiconductor layer 36. The connection electrode portion 37a may be disposed in a region from which the semiconductor stacked body S has been etched. The number and shape of the connection electrode portion 37a, a pitch between the connection electrode portions 37a, and contact resistance of the connection electrode portion 37a with respect to the first conductivity-type semiconductor layer 34 may be appropriately designed in such a manner that contact resistance is reduced. Also, the connection electrode portions 37a may be arranged in rows and columns on the semiconductor stacked body S to improve current flow. The second electrode 38 may include an ohmic contact layer 38a and a second electrode pad 38b on the second conductivity-type semiconductor layer 36.

The connection electrode portion 37a and the ohmic contact layer 38a may respectively include a conductive material having ohmic characteristics with respect to the first and second conductivity-type semiconductor layers 34 and 36, and may have a monolayer or a multilayer structure. For example, the connection electrode portion 37a and the ohmic contact layer 38a may include one or more of materials such as silver (Ag), aluminum (Al), nickel (Ni), chromium (Cr), and a transparent conductive oxide (TCO) through a process such as deposition or sputtering.

The first and second electrode pads 37b and 38b may be respectively connected to the connection electrode portion 37a and the ohmic contact layer 38a to serve as external terminals of the semiconductor LED chip 30. For example, the first and second electrode pads 37b and 38b may include Au, Ag, Al, Ti, W, Cu, Sn, Ni, Pt, Cr, NiSn, TiW, AuSn, or an eutectic metal thereof.

The first and second electrodes 37 and 38 may be disposed in the same direction, and, as illustrated in FIG. 1, the first and second electrodes 37 and 38 may be mounted in a so-called flip-chip bonding manner on a board on which wiring electrodes such as lead frames are provided.

The first and second electrodes 37 and 38 may be electrically separated by an insulating portion 33. The insulating portion 33 may include a material having electrical insulating properties. For example, an insulating material having low light absorption may be used. For example, the insulating portion 33 may include a silicon oxide or a silicon nitride such as $SiO_2$, $SiO_xN_y$, or $Si_xN_y$.

In an exemplary embodiment, the insulating portion 33 may have a light reflective structure in which a light reflective filler is dispersed in a translucent material. Alternatively, at least a portion of the insulating layer 33 may have a DBR structure in which a plurality of dielectric films having different refractive indices are alternately stacked. The DBR structure employed herein may be designed to have relatively high reflectivity compared to the DBR structure of the light distribution adjustment layer 39 described above.

Figure 3B:
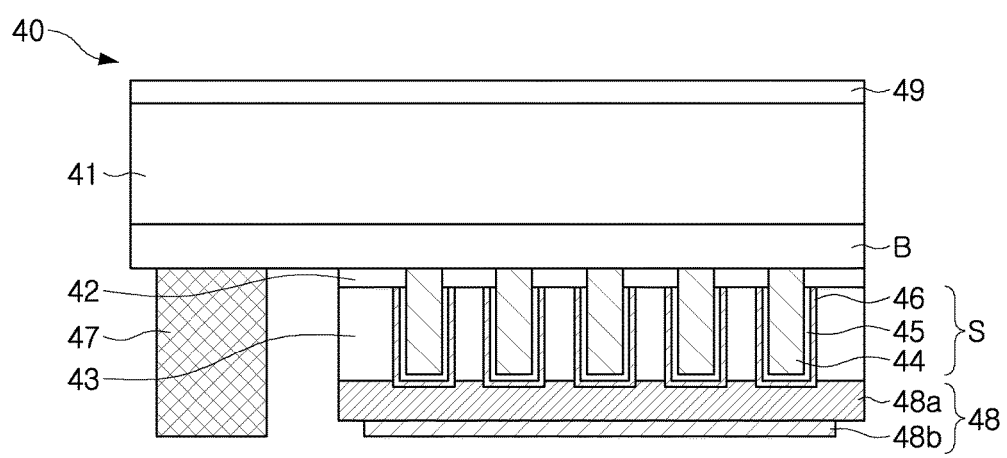

A semiconductor LED chip 40 illustrated in FIG. 3B includes a light-transmissive substrate 41, a first conductivity-type base layer B formed on one surface of the substrate 41, and a plurality of light emitting nanostructures S formed on the base layer B.

The semiconductor LED chip 40 may further include a first conductivity-type semiconductor base layer B, an insulating layer 42, and a filler portion 43. The light emitting nanostructures S may each include a first conductivity-type semiconductor nanocore 44, an active layer 45, and a second conductivity-type semiconductor layer 46 sequentially formed as shell layers on the surface of the nanocore 44.

In this example, the light emitting nanostructure S is illustrated as having a core-shell structure, but the light emitting nanostructure S is not limited thereto, and may have another structure such as a pyramidal structure, or the like. The first conductivity-type semiconductor base layer B may be a layer providing a growth surface of the nanocore 44. The insulating layer 42 may provide an open area for growth of the nanocore 44, and may include a dielectric material such as $SiO_2$ or $SiN_x$.

The filler portion 43 may serve to structurally protect the light emitting nanostructure S and allow light to be transmitted therethrough or reflected therefrom. Alternatively, when the filler portion 43 includes a light-transmissive material, the filler portion 43 may include a transparent material such as $SiO_2$, $SiN_x$, an elastic resin, silicone, an epoxy resin, a polymer, or plastic. In an exemplary embodiment, in a case in which the filler portion 43 includes a reflective material, the filler portion 43 may include metal powder having high reflectivity in a polymer material such as polypthalamide, or the like, or ceramic powder. The highly reflective ceramic powder may be at least one selected from the group consisting of $TiO_2$, $Al_2O_3$, $Nb_2O_5$, $Al_2O_3$, and ZnO. Alternatively, highly reflective metal powder, such as aluminum (A) or silver (Ag), may be used.

The first and second electrodes 47 and 48 may be disposed on a lower surface of the light emitting nanostructure S. The first electrode 47 may be positioned on an exposed surface of the first conductivity-type semiconductor base layer B, and the second electrode 48 may include a reflective ohmic contact layer 48a and an electrode pad 48b formed below the light emitting nanostructures S and the filler portion 43.

Also, in the present exemplary embodiment, similar to the previous exemplary embodiment, a light distribution adjustment layer 49 may be disposed on another surface of the light-transmissive substrate 41, that is, a main light emitting surface. The light distribution adjustment layer 49 is a reflective layer adjusting light distribution by reflecting light traveling in a direction perpendicular to the main light emission surface. For example, the light distribution adjustment layer 49 may be a DBR layer or a metal reflective layer.

Figure 3C:
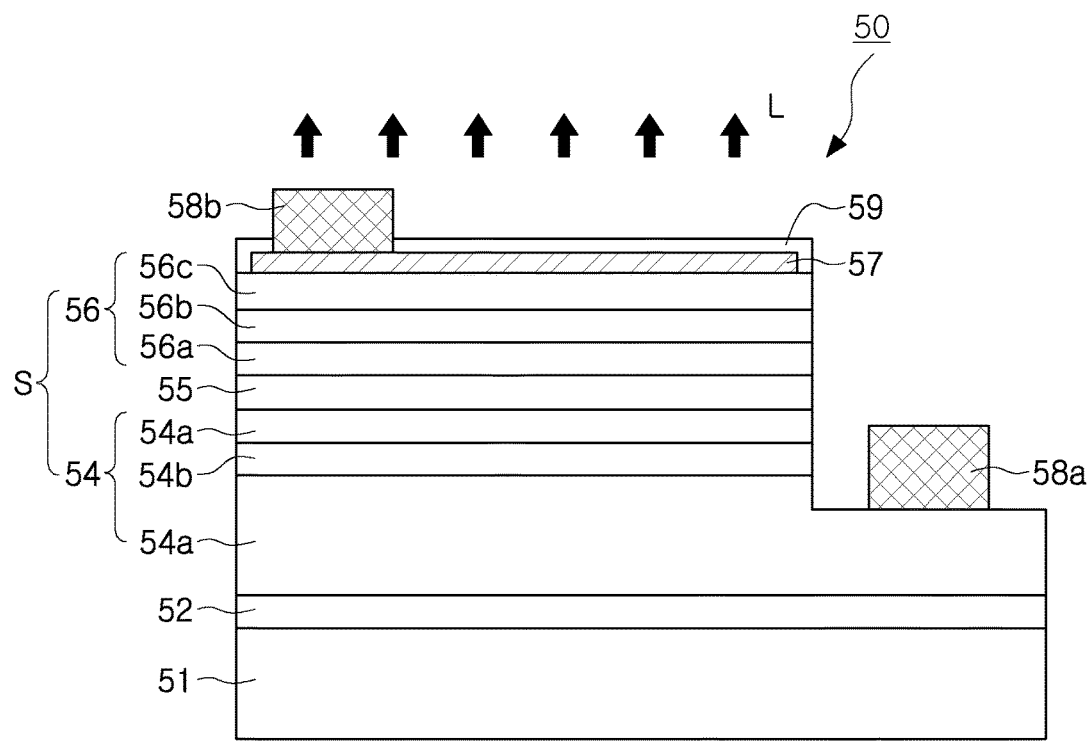

A semiconductor LED chip 50 illustrated in FIG. 3C may include a substrate 51, a semiconductor stacked body S on the substrate 51, and a light distribution adjustment layer 59 disposed on the semiconductor stacked body S.

Similar to the exemplary embodiment illustrated in FIG. 2, the substrate 51 may be an insulating substrate such as sapphire. A buffer layer 52 may include $In_xAl_yGa_{1-x-y}N$, where 0≤x≤1 and 0≤y≤1. The semiconductor stacked body S may include a first conductivity-type semiconductor layer 54, an active layer 55, and a second conductivity-type semiconductor layer 56. The active layer 55 may have a multi-quantum well (MQW) structure in which quantum well layers and quantum barrier layers are alternately stacked.

The first conductivity-type semiconductor layer 54 according to an exemplary embodiment may include a first conductivity-type semiconductor contact layer 54a and a current spreading layer 54b. An impurity concentration of the first conductivity-type semiconductor contact layer 54a may range from $2 \times 10^{18}$ cm$^{-3}$ to $9 \times 10^{19}$ cm$^{-3}$. A thickness of the first conductivity-type semiconductor contact layer 54a may range from 1 μm to 5 μm. The current spreading layer 54b may have a structure in which a plurality of In$_x$Al$_y$Ga$_{(1-x-y)}$N (where 0≤x, y≤1 and 0≤x+y≤1) layers having different compositions or different impurity contents are repeatedly stacked. For example, the current spreading layer 54b may be an n-type superlattice layer formed by repeatedly stacking two or more layers having different compositions formed of an n-type GaN layer and/or Al$_x$In$_y$Ga$_z$N (where 0≤x,y,z≤1) and having a thickness ranging from 1 nm to 500 nm. An impurity concentration of the current spreading layer 54b may range from $2 \times 10^{18}$ cm$^{-3}$ to $9 \times 10^{19}$ cm$^{-3}$. In an exemplary embodiment, the current spreading layer 54b may additionally include an insulating material layer.

As illustrated in FIG. 3C, the second conductivity-type semiconductor layer 56 may include an electron blocking layer (EBL) 56a, a low-concentration p-type GaN layer 15b, and a high concentration p-type GaN layer 56c provided as a contact layer. For example, the electron blocking layer 56a may have a structure in which In$_x$Al$_y$Ga$_{(1-x-y)}$N (where 0≤x≤1, 0≤y≤1, and 0≤x+≤1) layers having a thickness ranging from 5 nm to 100 nm and having different compositions are stacked, or may be a monolayer formed of Al$_y$Ga$_{(1-y)}$N, where 0<y≤1. An energy band gap of the electron blocking layer 56a may decrease in a direction away from the active layer 55. For example, an aluminum (Al) composition of the electron blocking layer 56a may decrease in a direction away from the active layer 55.

The semiconductor LED chip 50 may include a first electrode 58a disposed on the first conductivity-type semiconductor layer 54 and an ohmic contact layer 57 and a second electrode 58b sequentially disposed on the second conductivity-type semiconductor layer 56.

In an exemplary embodiment, the light distribution adjustment layer 59 may be formed to cover an upper surface of the semiconductor stacked body S. For example, the light distribution adjustment layer 59 may be formed to cover the ohmic contact layer 57. The light distribution adjustment layer 59 may be configured as a DBR layer having electrical insulating properties, and as illustrated in FIG. 3C, the light distribution adjustment layer 59 may be formed such that the first electrode 58a is exposed. In addition, similar to the exemplary embodiment illustrated in FIG. 3A, the light distribution adjustment layer 59 may extend to a side surface of the chip 50.

Figure 3D:
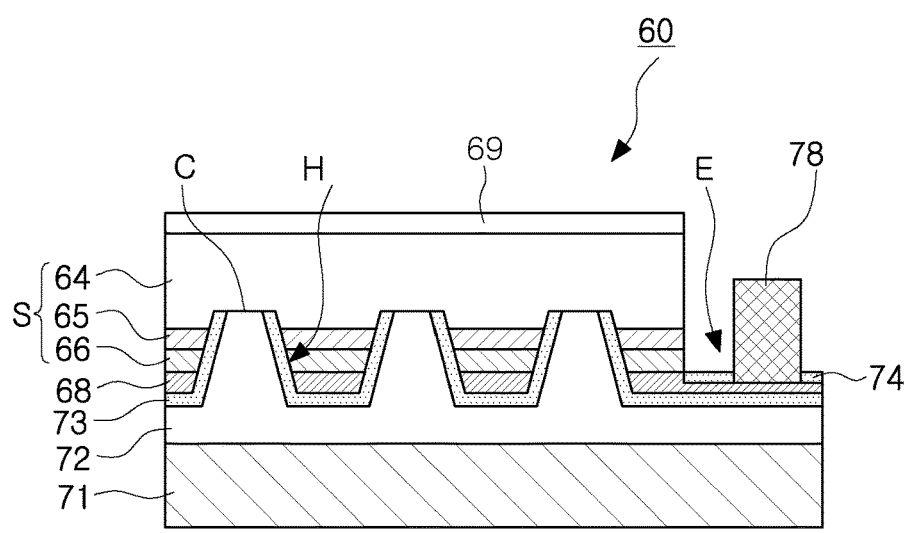

FIG. 3D illustrates a semiconductor LED chip having a different structure in which the light distribution adjustment layer according to an exemplary embodiment is applied. The semiconductor LED chip 60 illustrated in FIG. 3D may be a chip having a larger area for higher output, which may be used for lighting (or illumination).

Referring to FIG. 3D, the semiconductor LED chip 60 includes a semiconductor stacked body S, a first electrode 72, an insulating layer 73, a second electrode 68, and a substrate 71. The semiconductor stacked body S may include a first conductivity-type semiconductor layer 64, an active layer 65, and a second conductivity-type semiconductor layer 66 which are sequentially stacked.

In order for the first electrode 72 to be electrically connected to the first conductivity-type semiconductor layer 64, the first electrode 72 may include at least one conductive via H extending to at least a partial region of the first conductivity-type semiconductor layer 64 and electrically insulated from the second conductivity-type semiconductor layer 66 and the active layer 65. The conductive via H may extend from a surface of the first electrode 72 to an interior of the first conductivity-type semiconductor layer 64 through the second electrode 68, the second conductivity-type semiconductor layer 66, and the active layer 65. The conductive via H may be formed using an etching process, such as inductively coupled plasma-reactive ion etching (ICP-RIE), or the like.

An insulating layer 73 is provided on the first electrode 72 to electrically insulate the first electrode 72 from regions other than the conductive substrate 71 and the first conductivity-type semiconductor layer 64. As illustrated in FIG. 3D, the insulating layer 73 is also formed on a side surface of the conductive via H, as well as between the second electrode 68 and the first electrode 72. Thus, the insulating layer 73 may insulate the first electrode 72 from the second electrode 68, the second conductivity-type semiconductor layer 66, and the active layer 65 exposed to the side surface of the conductive via H. The insulating layer 73 may be formed by depositing an insulating material such as SiO$_2$, SiO$_x$N$_y$, or Si$_x$N$_y$.

A contact region C of the first conductivity-type semiconductor layer 64 is exposed by the conductive via H, and a partial region of the first electrode 72 may be formed to be in contact with the contact region C through the conductive via H. Accordingly, the first electrode 73 may be connected to the first conductivity-type semiconductor layer 64.

To reduce contact resistance, the number and a shape of the conductive vias H, a pitch between the conductive vias H, and a contact diameter (or a contact area) of the conductive via H with respect to the first and second conductivity-type semiconductor layers 64 and 66 may be appropriately adjusted. The conductive via H may be arranged in various forms in rows and columns to improve current flow.

As illustrated in FIG. 3D, the second electrode 68 extends outwardly from the semiconductor stacked body S to provide an electrode formation region E. The electrode formation region E may have an electrode pad portion 78 for connecting an external power source to the second electrode 68. A single electrode formation region E is illustrated, but, depending on an embodiment, a plurality of electrode formation regions may be provided. The electrode formation region E may be formed at a corner of one side of the chip 60 to increase a light emitting area.

As in the present exemplary embodiment, an etch stop insulating layer 74 may be disposed around the electrode pad portion 78. The etch stop insulating layer 74 may be formed in the electrode formation region E after the formation of the semiconductor stacked body S or before the formation of the second electrode 68, and may act as an etching stop during an etching process for the electrode formation region E.

The second electrode 68 may include a material having high reflectivity, while forming ohmic contact with the second conductivity-type semiconductor layer 66. As the material of the second electrode 68, the reflective electrode material mentioned above may be used.

In the present exemplary embodiment, a light distribution adjustment layer 69 may be disposed on an upper surface of the semiconductor stacked body S, that is, on an upper surface of the first conductivity-type semiconductor layer

64. In an exemplary embodiment, the light distribution adjustment layer 69 may extend to a side surface of the chip 60, and the light distribution adjustment layer 69 may extend such that the electrode pad 78 is opened.

In this manner, in the various semiconductor LED chip structures, by introducing the light distribution adjustment layers 39, 49, 59, and 69 to the main light emitting surface in the chip level, the light distribution adjustment layers 39, 49, 59, and 69 may perform a function the same as or similar to a light distribution function of an optical structure such as a lens, and when the light distribution adjustment layers 39, 49, 59, and 69 are eventually applied to a product, an additional optical structure may be omitted.

To confirm a change in transmissivity according to an incident angle and a corresponding light distribution control effect in the DBR structure introduced as a light distribution adjustment layer, specific experiments were conducted as follows.

EXPERIMENTAL EXAMPLE

Effect of Light Distribution Adjustment Layer

In the present experimental example, a DBR layer was formed as a light distribution adjustment layer that may be applied to a surface of a light-transmissive substrate of a semiconductor LED chip. That is, $TiO_2$ and $SiO_2$, respectively having thicknesses of 424 Å and 466 Å, were alternately grown seven times to form a DBR layer having a thickness of 623 nm.

Figure 4:
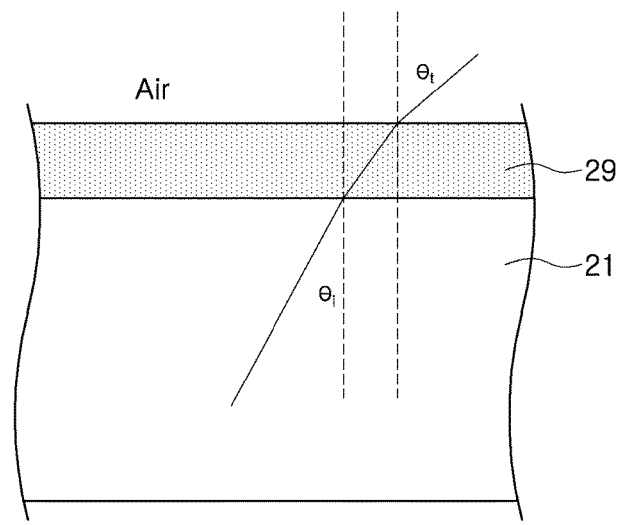
FIG. 4 is a schematic view illustrating transmission of light emitted from a semiconductor LED chip through a light distribution adjustment layer.

As illustrated in FIG. 4, light passing through a DBR layer 29 may emit at an angle ($\theta_t$) greater than an angle ($\theta_i$) at which light is incident to the DBR layer 29 due to a change in refractive index (Snell's law). Exit angles depending on incident angles (0°, 10°, 20°, and 30°) and transmissivity depending on the incident angles were calculated and illustrated in FIGS. 5A through 5D. Here, the dotted lines represent emission light spectrums of a semiconductor LED chip having a peak wavelength of 450 nm, and the solid lines represent transmissivity distributions according to incident angles of the DBR layer manufactured in the present experimental example.

When the incident angles are 0°, 10°, 20°, and 30°, light which has passed through the DBR layer may be emitted at exit angles of 0°, 18°, 37.5°, and 62.8°, respectively.

Figure 5A:
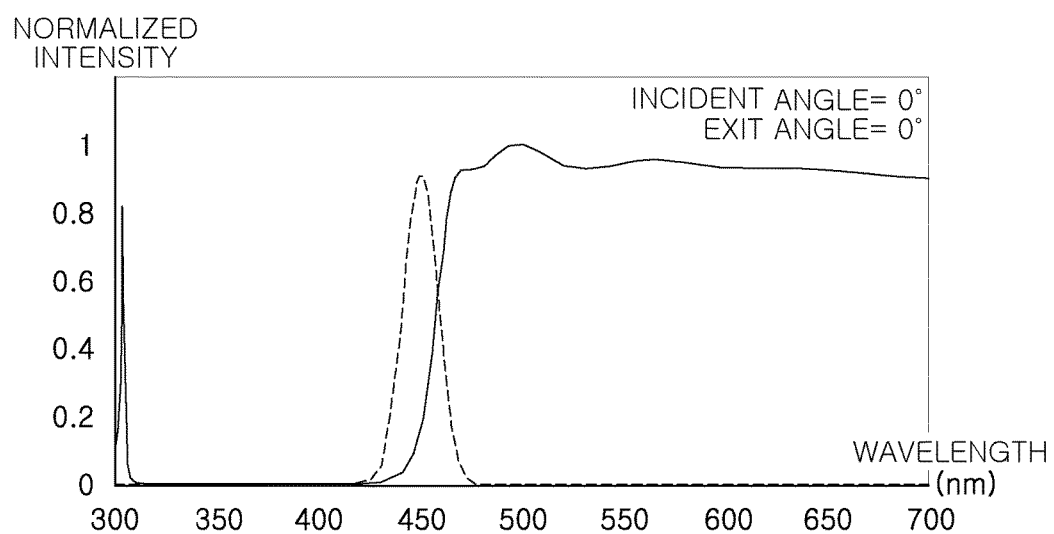
FIGS. 5A through 5D are graphs illustrating transmissivity of light emitted from a DBR layer at various incident angles according to an experimental example.
Figure 5B:
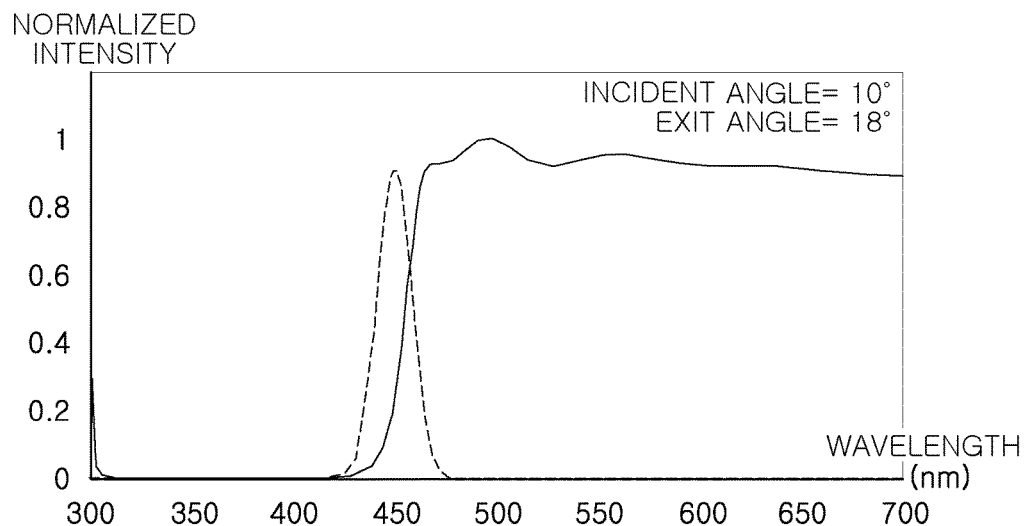
Figure 5C:
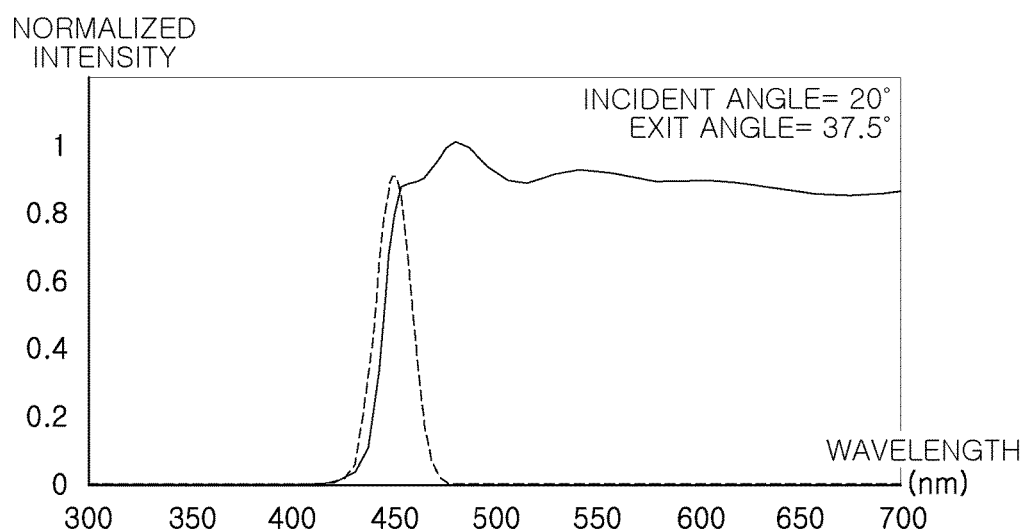
Figure 5D:
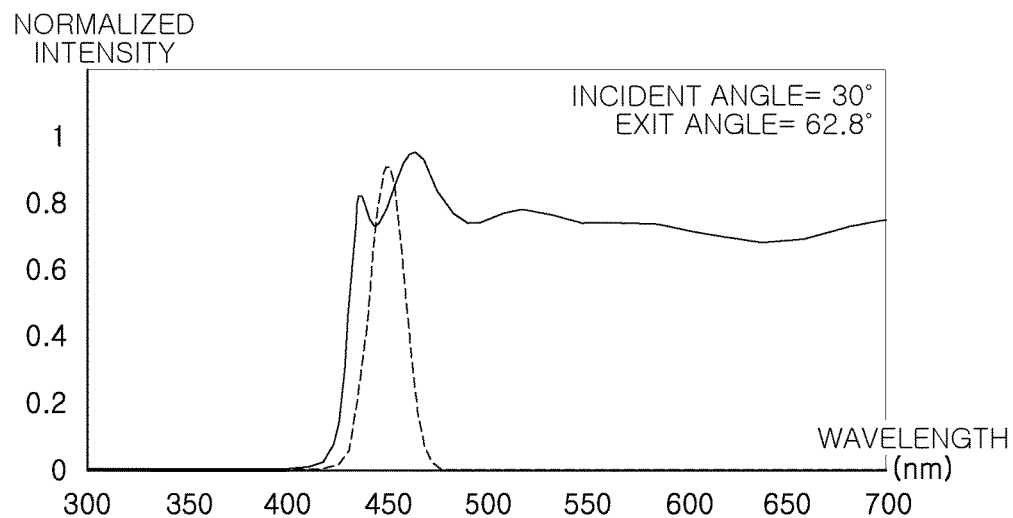

Referring to transmissivity according to incident angles, as illustrated in FIGS. 5A and 5B, it can be seen that an emission light spectrum of the LED chip shows lower transmissivity under conditions in which light is incident at low incident angles of 0° and 10°, respectively. In this case, light is mostly reflected to the interior of the chip again, and a low amount of light will be emitted at corresponding exit angles of 0° and 18°, respectively. As illustrated in FIGS. 5C and 5D, when the incident angles are increased to 20° and 30°, an emission light spectrum of the LED chip shows higher transmissivity, and a larger amount of light is likely to be emitted at the corresponding exit angles 37.5° and 62.8°, respectively.

Based on the above measurements, with respect to light having a wavelength of 450 nm, transmissivity of the DBR layer was calculated in relation to an exit angle, and light distribution of light which has been transmitted through the DBR layer was calculated. The results are illustrated in FIGS. 6 and 7.

Figure 6:
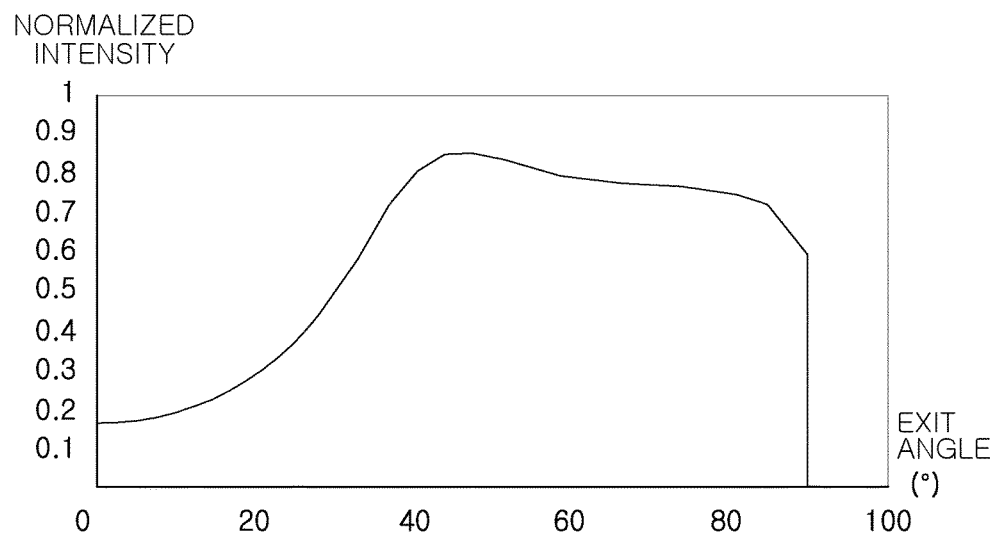
FIG. 6 is a graph illustrating transmissivity of light emitted from a DBR layer at respective incident angle according to an experimental example.
Figure 7:
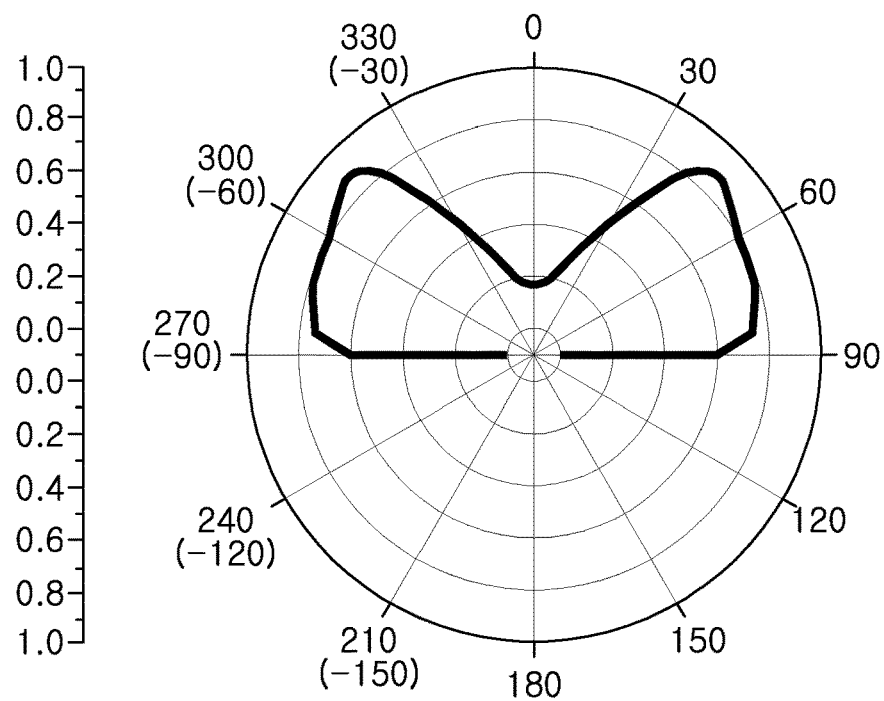
FIG. 7 is a polar chart illustrating light distribution according to an experimental example.

As illustrated in FIG. 6, it can be seen that, when an exit angle is increased to be greater than 20°, transmissivity is increased, and the transmissivity is highest in the vicinity of exit angle of 40°, and overall higher transmissivity is maintained at angles higher than 40°.

Thus, due to the change in the transmissivity of the DBR layer depending on light incident angles, an amount of light emitted along a central axis may be substantially reduced due to reflection, while high transmissivity may be maintained in a region at an angle range distant from the central axis. As a result, light transmitting through the DBR layer may have light distribution having a batwing shape as illustrated in FIG. 7.

The inventive concept may also be variously applied or modified in a module structure such as a package in which a semiconductor LED chip is mounted.

Figure 8:
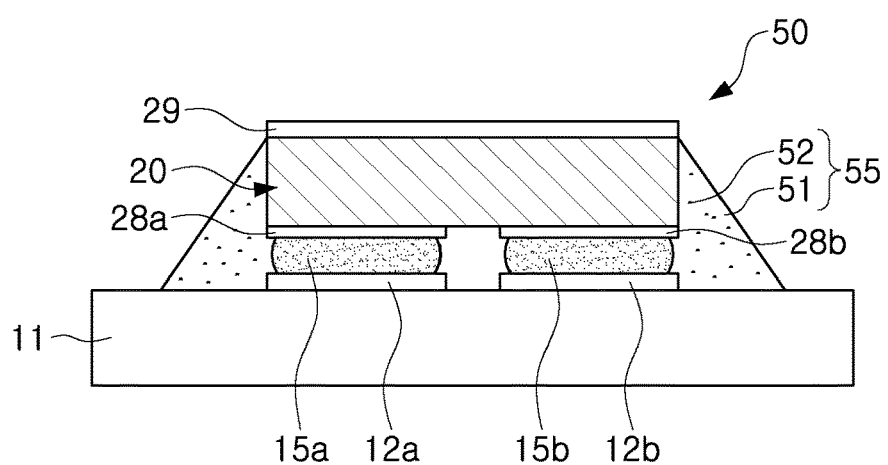
FIG. 8 is a side cross-sectional view illustrating a semiconductor light emitting device according to an exemplary embodiment.

FIG. 8 is a view illustrating an example of a semiconductor light emitting device according to another exemplary embodiment, in which a reflective portion 55 is introduced to a side surface of a chip at a package level to additionally adjust light distribution.

Referring to FIG. 8, similar to the semiconductor light emitting device illustrated in FIG. 1, the semiconductor light emitting device 50 includes a wiring board 11 and a semiconductor LED chip 20 mounted on or above a mounting surface of the wiring board 11.

The semiconductor LED chip 20 may have a first surface on which first and second electrodes 28a and 28b are disposed, a second surface positioned to oppose the first surface, and side surfaces positioned between the first and second surfaces. The semiconductor LED chip 20 may include a DBR layer as a light distribution adjustment layer 29 on the second surface thereof.

As illustrated in FIG. 8, the lateral reflective portion 55 may be disposed to surround the mounted semiconductor LED chip 20. The lateral reflective portion 55 may serve to restrain a component of light emitted in a lateral direction and guide light to be emitted through the light distribution adjustment layer 29. The lateral reflective portion 55 may include a light-transmissive resin 51 containing reflective powder 52. The reflective powder 52 may be white ceramic powder or metal powder. For example, the ceramic powder may be at least one selected from the group consisting of $TiO_2$, $Al_2O_3$, $Nb_2O_5$, $Al_2O_3$, and ZnO. The metal powder may be a material such as aluminum (Al) or silver (Ag).

As described above in the previous exemplary embodiment, a distribution of light that transmits through the light distribution adjustment layer 29 may be adjusted due to a difference in transmissivity depending on light incident angles. In the light distribution adjustment layer 29, light emitted in a region away from a central axis thereof may be increased, compared with a region closer to the central axis perpendicular to the second surface. Thus, unlike the structure illustrated in FIG. 1, without being greatly affected by light Ls emitted from the side surfaces of the semiconductor LED chip 20, a final light distribution may be substantially determined by light emitted from the light distribution adjustment layer 29, and the final light distribution may be different from that of the structure illustrated in FIG. 1.

Hereinafter, introduction of the light distribution adjustment layer and a change in light distribution due to the lateral reflective portion will be described in detail with reference to Embodiments 1 and 2, and Comparative Examples 1 and 2.

Embodiment 1

A semiconductor light emitting device having a structure similar to that of the semiconductor light emitting device illustrated in FIG. 1 was prepared. As the semiconductor LED chip, a semiconductor LED chip having a peak wavelength of 450 nm was prepared, and as a light distribution adjustment layer, a DBR layer (overall thickness: about 712 nm) satisfying the conditions of Table 1 below was formed on a surface of a sapphire substrate of the chip. As a wiring board on which the chip is mounted, a package board having a surface coated with a silver (Ag) film was used.

TABLE 1

| No | Material | Thickness (nm) |
|---|---|---|
| 1 | $TiO_2$ | 23.3 |
| 2 | $SiO_2$ | 42.4 |
| 3 | $TiO_2$ | 46.6 |
| 4 | $SiO_2$ | 42.4 |
| 5 | $TiO_2$ | 46.6 |
| 6 | $SiO_2$ | 42.4 |
| 7 | $TiO_2$ | 46.6 |
| 8 | $SiO_2$ | 42.4 |
| 9 | $TiO_2$ | 46.6 |
| 10 | $SiO_2$ | 42.4 |
| 11 | $TiO_2$ | 46.6 |
| 12 | $SiO_2$ | 42.4 |
| 13 | $TiO_2$ | 46.6 |
| 14 | $SiO_2$ | 42.4 |
| 15 | $TiO_2$ | 46.6 |
| 16 | $SiO_2$ | 42.4 |
| 17 | $TiO_2$ | 23.3 |

Embodiment 2

A semiconductor light emitting device using a semiconductor LED chip including a light distribution adjustment layer, similar to that of Embodiment 1 was manufactured. However, after the chip is mounted, a lateral reflective portion using a resin containing $TiO_2$ white powder was additionally formed, similar to the structure illustrated in FIG. 8.

Comparative Examples 1 and 2

In Comparative Examples 1 and 2, semiconductor light emitting devices were manufactured to be similar to those of Embodiments 1 and 2, except that a light distribution adjustment layer was not introduced to semiconductor LED chips.

Light extraction efficiency (EXE) and beam angles of the semiconductor light emitting devices obtained in Embodiments 1 and 2 and Comparative Examples 1 and 2 were measured. The results are illustrated in Table 2 below. Also, light distributions of Embodiments 1 and 2 and Comparative Example 2 were measured and illustrated in the polar charts of FIGS. 9A through 9C, respectively.

TABLE 2

| Classification | Embodiment 1 | Comparative Example 1 | Embodiment 2 | Comparative Example 2 |
|---|---|---|---|---|
| Light extraction efficiency (EXE) | 0.6455 | 0.6908 | 0.4695 | 0.5906 |
| Light emitting ratio (Embodiment/Comparative Example) | 0.94 | 1 | 0.80 | 1 |
| Beam angle (°) | 172 | 157 | 164 | 46 |

Figure 9A:
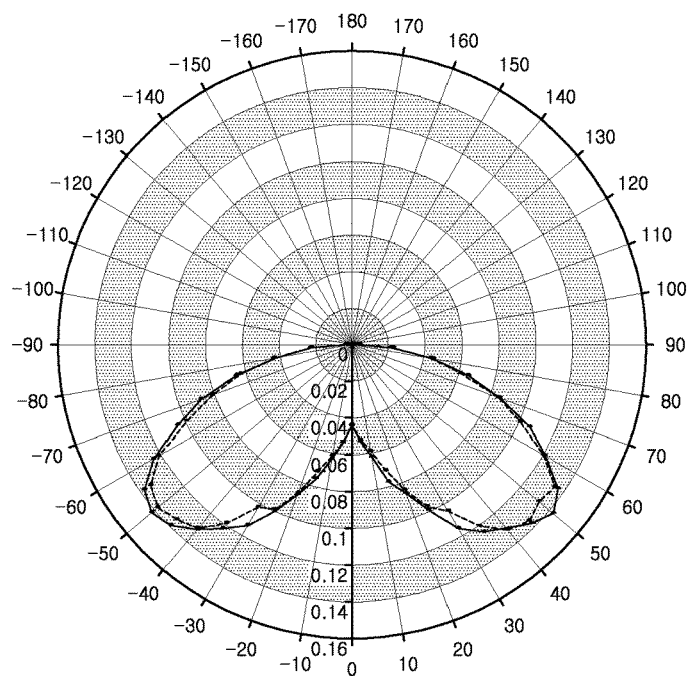
FIGS. 9A through 9C are polar charts illustrating light distributions of semiconductor light emitting devices according to Embodiments 1 and 2 and Comparative Example 2, respectively.
Figure 9B:
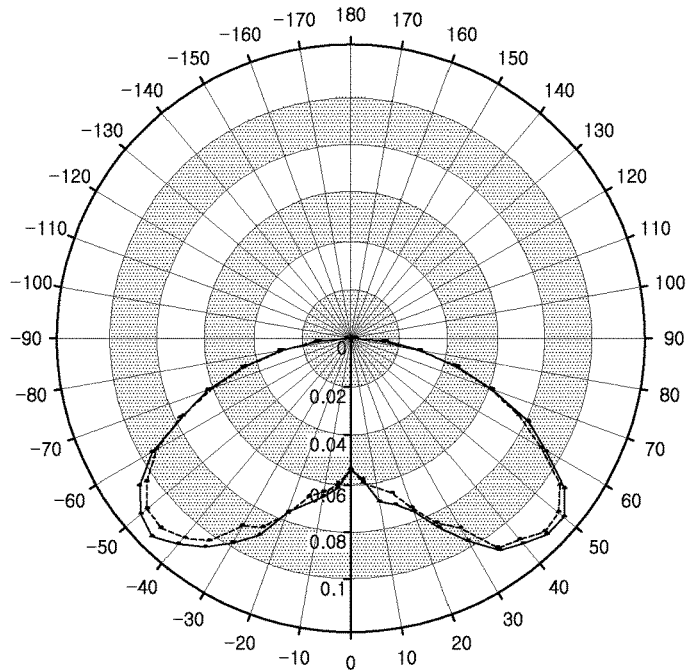
Figure 9C:
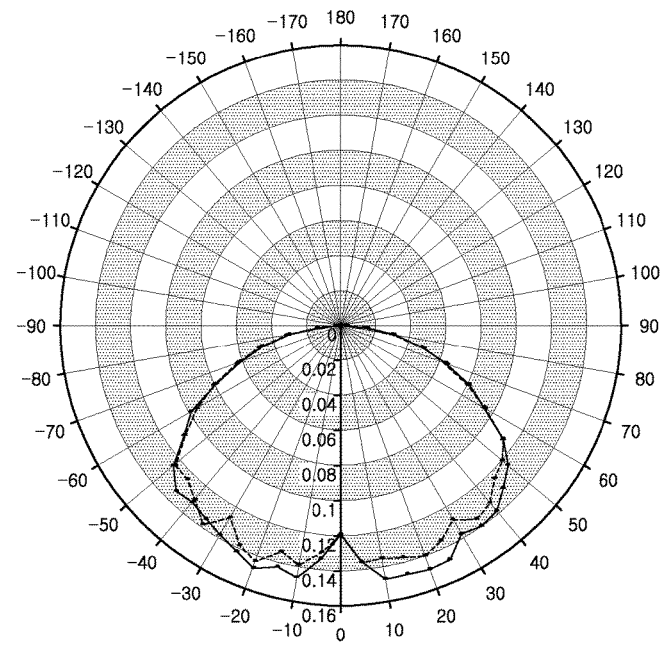

As illustrated in Table 2, it can be seen that, in Embodiments 1 and 2, amounts of extracted light were slightly reduced, compared with those of Comparative Examples 1 and 2, but the beam angles were greatly enlarged. Specifically, in the light distributions illustrated in FIGS. 9A through 9C, it can be seen that an amount of light in a vertical direction was conspicuously reduced, and an amount of light according to Embodiments 1 and 2 in the lateral direction was relatively large (FIGS. 9A and 9B), compared with Comparative Example 2 (FIG. 9C).

In addition, an effect of introducing the DBR layer as a light distribution adjustment layer to an actual commercialized product was examined.

Embodiment 3 and Comparative Example 3

As an actual commercialized product, an LED package FCOM™ was prepared. In Embodiment 3, a DBR layer (overall thickness: about 712 nm) satisfying the conditions of Table 1 was formed on a surface of a sapphire substrate of the CHIP. As in Comparative Example 3, the same product without the light distribution adjustment layer was used.

Figure 10A:
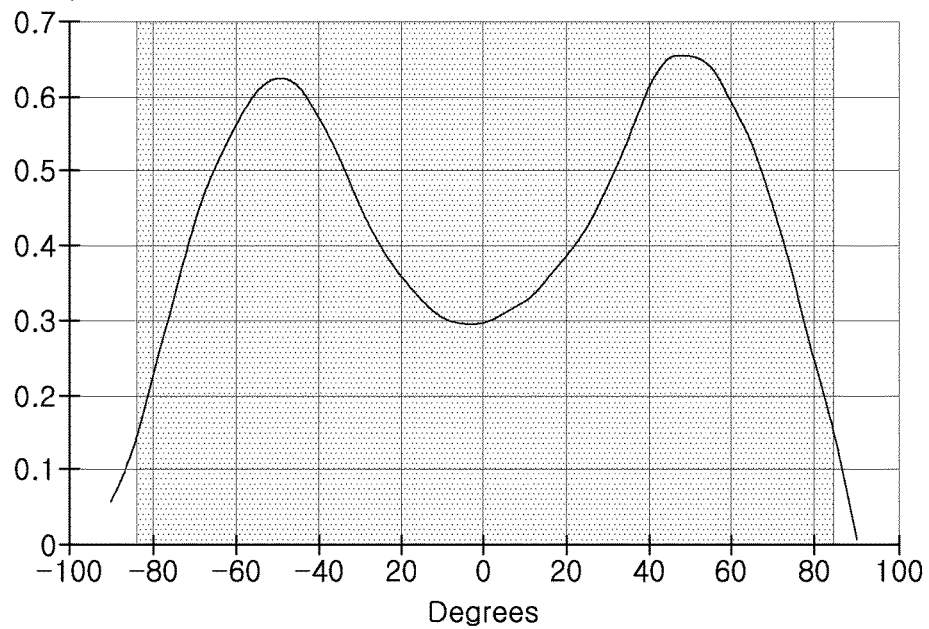
FIGS. 10A and 10B are graphs illustrating light distributions of semiconductor light emitting devices according to Embodiment 3 and Comparative Example 3, respectively.
Figure 10B:
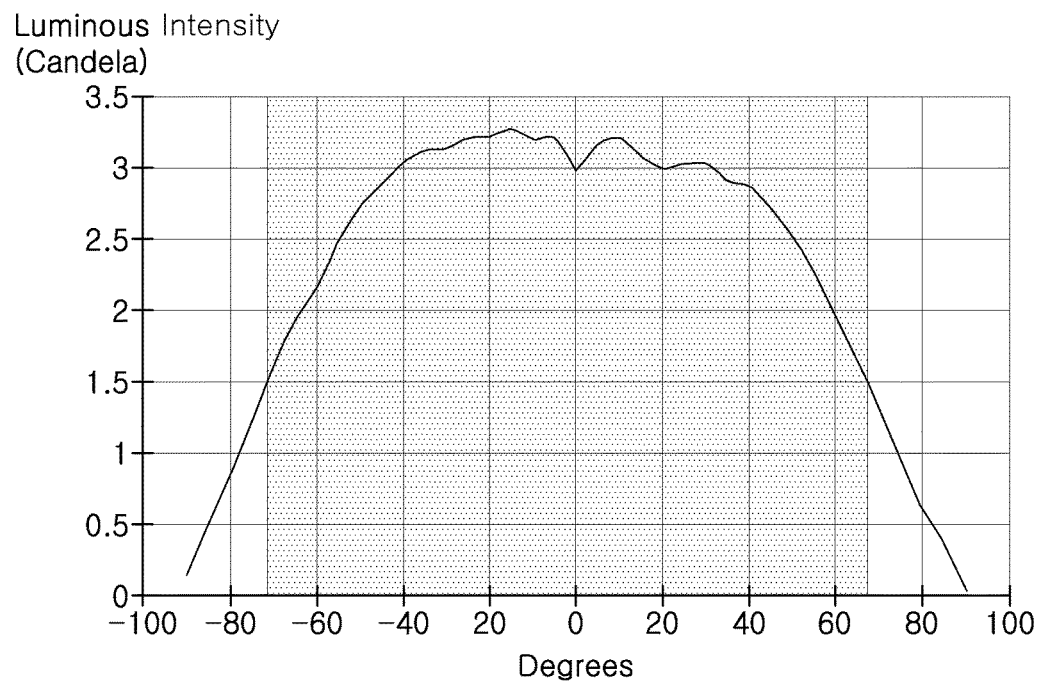
Figure 11A:
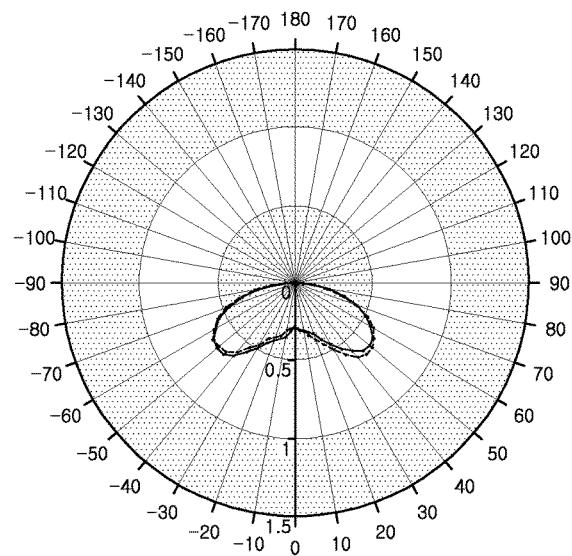
FIGS. 11A and 11B are polar charts illustrating light distribution of the semiconductor light emitting devices according to Embodiment 3 and Comparative Example 3, respectively.
Figure 11B:
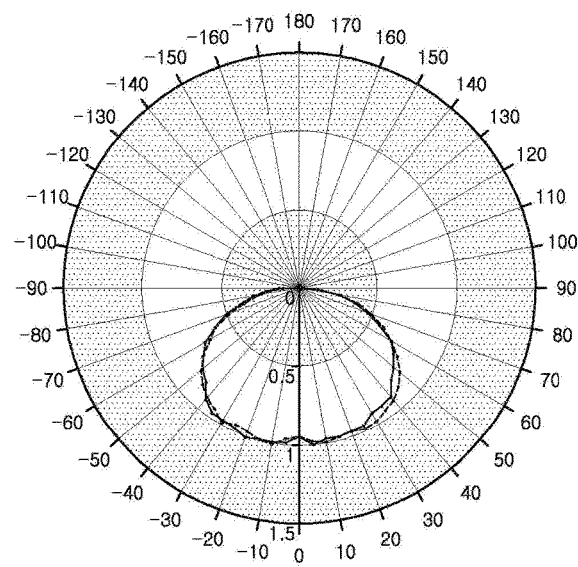

The packages of Embodiment 3 and Comparative Example 3 were operated under the same driving conditions (100 mA/3.27 V), and color coordinates, beam angles, and amounts of light emitted therefrom were measured. Light distributions of the packages are illustrated as two-dimensional (2D) graphs (FIGS. 10A and 10B) and polar charts (FIGS. 11A and 11B).

It can be seen that characteristics such as actual color coordinates were rarely changed, while beam angles and light distributions were significantly changed. In particular, the beam angle of Comparative Example was merely 140.5° (FIGS. 10B and 11B), while that of Embodiment 3 was greatly increased to 168° (FIGS. 10A and 11A). In this manner, in the present exemplary embodiment, substantially uniform light distribution in a light distribution area may be easily obtained by suppressing light traveling in a vertical direction and maintaining a relatively large amount of light in a horizontal direction.

In the case of the present exemplary embodiment, an amount of light was slightly reduced, but such a reduction in light may be understood as corresponding to a level unavoidably generated even in an optical structure (a lens or the like) employed to adjust light distribution in the related art.

Figure 12A:
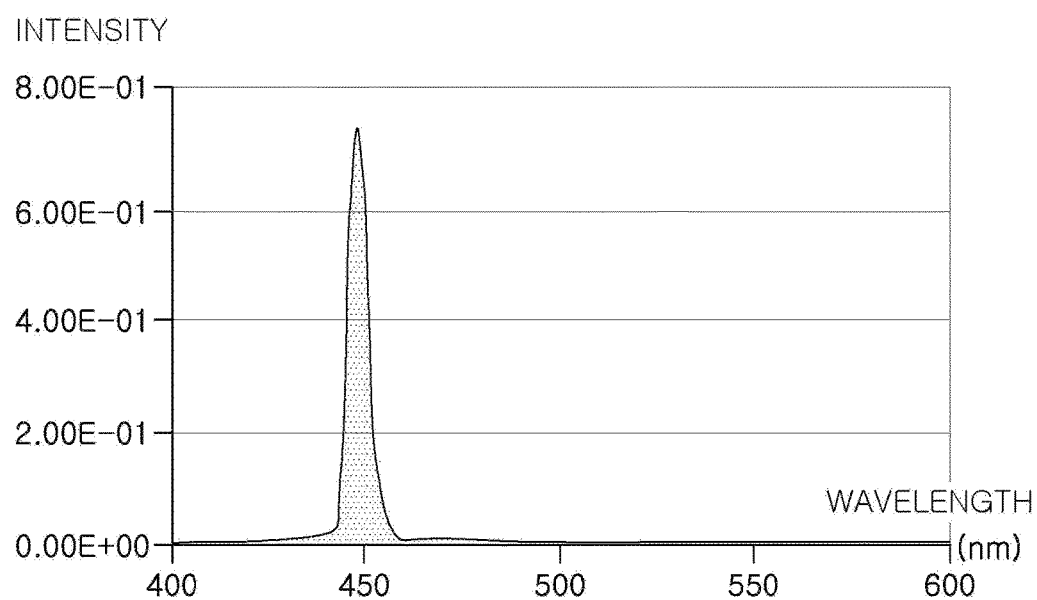
FIGS. 12A and 12B are graphs illustrating spectral distributions of the semiconductor light emitting devices according to Embodiment 3 and Comparative Example 3, respectively.
Figure 12B:
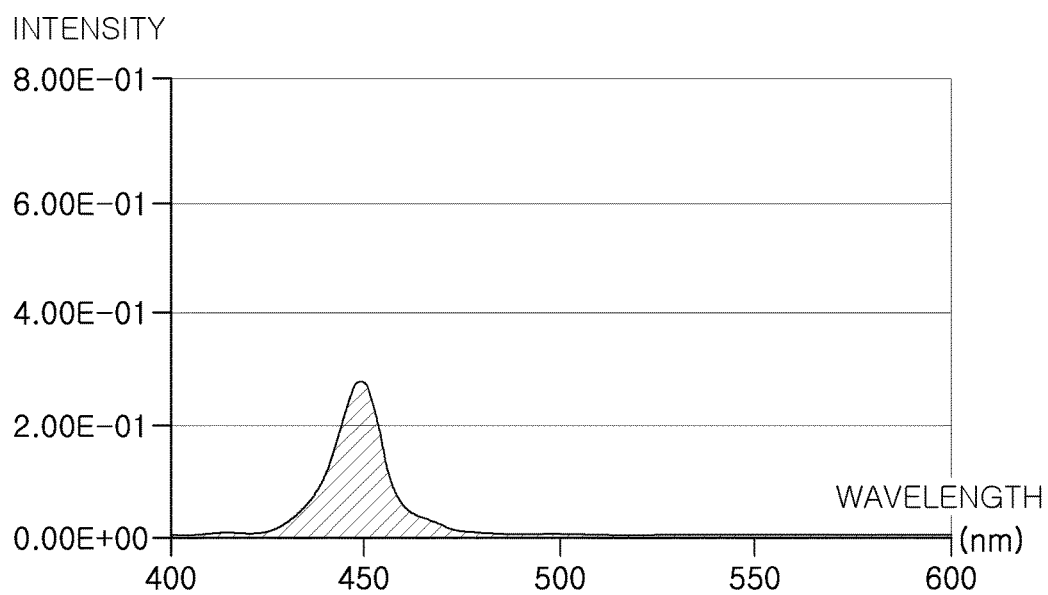

FIGS. 12A and 12B are graphs illustrating spectral distributions of the semiconductor light emitting devices according to Embodiment 3 and Comparative Example 3, which show relative distributions of each wavelength band when overall amounts of light measured from the respective light emitting devices is 1 (i.e., each of integrated values of measured amounts of light is 1) are illustrated.

It can be seen from FIG. 12A that, in Embodiment 3, only light having a wavelength of 450 nm is selectively transmitted due to the introduction of the DBR light distribution adjustment layer, while, in Comparative Example 3, not only light having a wavelength of 450 nm but also light having a wavelength around 450 nm is distributed as shown in FIG. 12B

In this manner, according to the present exemplary embodiment, since an introduction of an optical structure such as an additional lens, or the like, is omitted by introducing the light distribution adjustment layer at the chip level, manufacturing cost, as well as a possibility of defects due to assembly, may be substantially reduced, and a final product may be reduced in size (obtaining a slim display, for example).

In addition to the exemplary embodiments described above, the semiconductor light emitting devices according to the present inventive concept may also be modified and implemented.

Figure 13A:
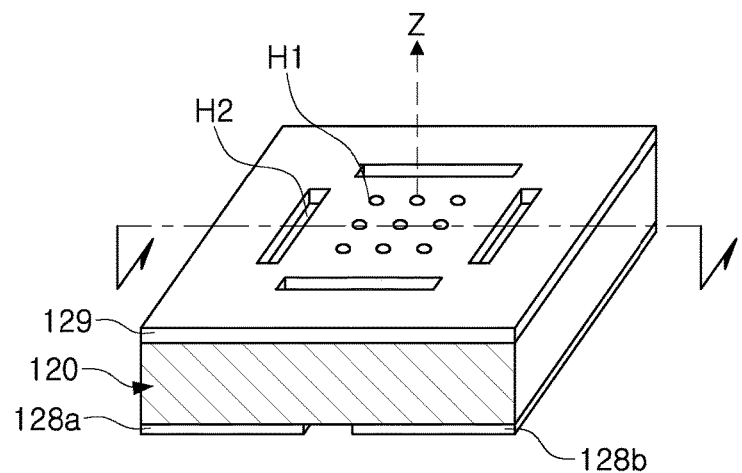
FIG. 13A is a perspective view illustrating a semiconductor LED chip according to an exemplary embodiment.
Figure 13B:
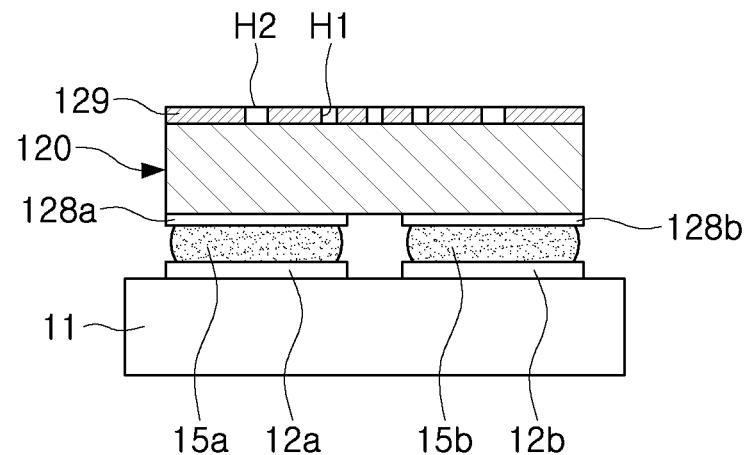
FIG. 13B is a side cross-sectional view illustrating a semiconductor light emitting device employing the semiconductor LED chip illustrated in FIG. 13A.

FIG. 13A is a perspective view illustrating a semiconductor LED chip 120 according to an exemplary embodiment, and FIG. 13B is a side cross-sectional view illustrating a semiconductor light emitting device 130 employing the semiconductor LED chip illustrated in FIG. 13A.

Referring to FIG. 13A, the semiconductor LED chip 120 may have a first surface on which first and second electrodes 128a and 128b are disposed, a second surface opposing the first surface, and side surfaces positioned between the first and second surfaces. A metal reflective layer 129 may be disposed as a light distribution adjustment layer on the second surface of the semiconductor LED chip 120.

In a semiconductor light emitting device 130 illustrated in FIG. 13B, the semiconductor LED chip 120 may be mounted in such a manner that the first surface thereof faces a mounting surface of a wiring board 11, and the first and second electrodes 128a and 128b may be connected to first and second wiring electrodes 12a and 12b through solder balls 15a and 15b, respectively.

The metal reflective layer 129 according to the present exemplary embodiment serves to reflect light traveling in a direction perpendicular to the second surface to thereby adjust light distribution. Unlike a DBR layer using wavelength selectivity or transmissivity based on an incident angle, the metal reflective layer 129 rarely allows light traveling in a vertical direction to be transmitted therethrough. Light internally reflected by the metal reflective layer 129 is induced to be emitted to the side surfaces of the semiconductor LED chip 120, whereby overall light distribution may be adjusted. As a result, without light transmitted through the metal reflective layer 129, light distribution having a batwing shape may be formed due to an increase in an amount of light emitted from the sides of the chip.

However, as in the present exemplary embodiment, holes H1 and H2 for light transmission may be formed on the metal reflective layer 129 so that a partial amount of light may be emitted in a vertical direction to form desired light distribution. The light transmission holes H1 and H2 may have various shapes. For example, the light transmission holes H1 and H2 may be holes H1 having a dot shape (for example, a circular shape or a square shape) or may be holes H2 having a groove shape. Also, as in the present exemplary embodiment, the light transmission holes H1 and H2 may have a symmetrical structure to obtain uniform light distribution in a certain horizontal axis direction, or alternatively, the light transmission holes H1 and H2 may have an asymmetrical shape or arrangement to obtain asymmetrical light distribution relative to a horizontal axis.

In the present exemplary embodiment, an example in which the light transmission holes H1 and H2 are formed on the metal reflective layer 129 is illustrated, but the light transmission holes H1 and H2 may also be employed in a light distribution adjustment layer configured as a DBR.

Figure 14A:
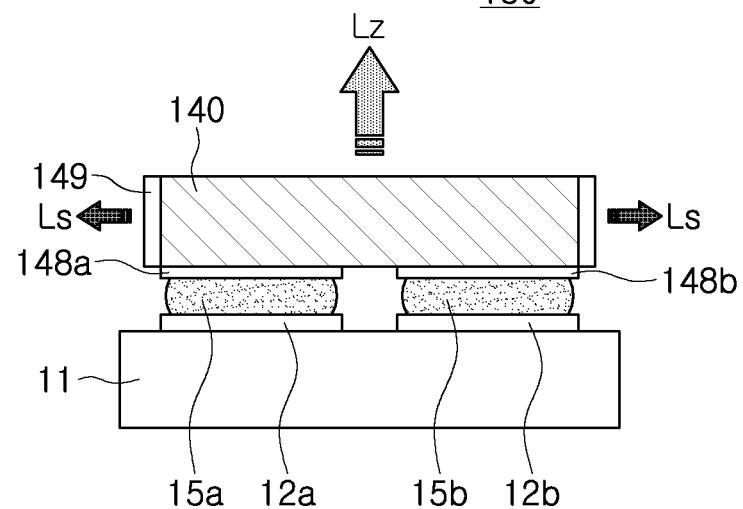
FIG. 14A is a side cross-sectional view illustrating a semiconductor light emitting device according to an exemplary embodiment.

FIG. 14A is a side cross-sectional view illustrating a semiconductor light emitting device according to an exemplary embodiment.

Referring to FIG. 14A, a semiconductor light emitting device 150 according to the present exemplary embodiment includes a wiring board having a mounting surface and a semiconductor LED chip 140 mounted on or above the mounting surface of the wiring board 11.

The semiconductor LED chip 140 is mounted such that a first surface thereof faces the mounting surface, and first and second electrodes 148a and 148b may be connected to the first and second wiring electrodes 12a and 12b via the solder balls 15a and 15b, respectively. The semiconductor LED chip 140 may have the first surface on which the first and second electrodes 148a and 148b are mounted, a second surface positioned to oppose the first surface, and side surfaces positioned between the first and second surfaces.

In the present exemplary embodiment, a light distribution adjustment layer 149 may be disposed only on the side surfaces of the semiconductor LED chip 140, rather than on the second surface of the semiconductor LED chip 140, that is, a main light emitting surface. The light distribution adjustment layer 149 employed in the present exemplary embodiment may be a DBR layer or a metal reflective layer having wavelength selectivity.

Figure 14B:
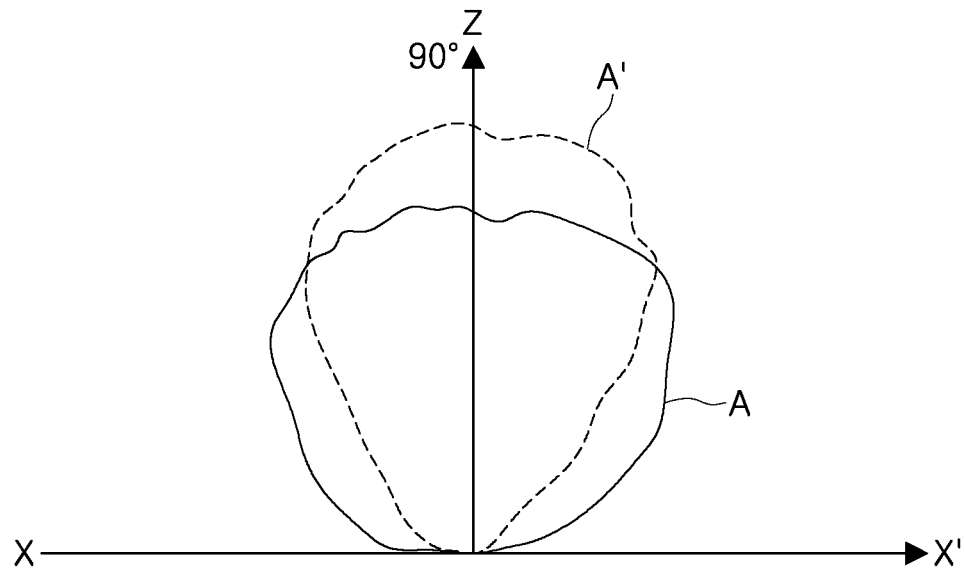
FIG. 14B is a graph schematically illustrating light distribution of the semiconductor LED chip illustrated in FIG. 14A.

FIG. 14B illustrates light distributions before and after introduction of the light distribution adjustment layer 149 illustrated in FIG. 14A. Here, X represents an axis parallel with the second surface of the chip 140 and Z represents an axis perpendicular to the second surface.

Referring to FIG. 14B, light distribution A is formed before introduction of the light distribution adjustment layer 149. In contrast, when the light distribution adjustment layer 149 is introduced, the light distribution adjustment layer 149 may reduce an amount of light Ls traveling to the sides, reducing luminance in a direction (horizontal direction) closer to the X axis, as represented by light distribution A'. Also, light re-reflected to the interior of the chip 140 by the light distribution adjustment layer 149 contributes to an amount of light Lz oriented upwardly from the second surface, increasing an amount of light closer to the Z axis. In this manner, light distribution different from that of the exemplary embodiment illustrated in FIG. 1 may be obtained.

Figure 15:
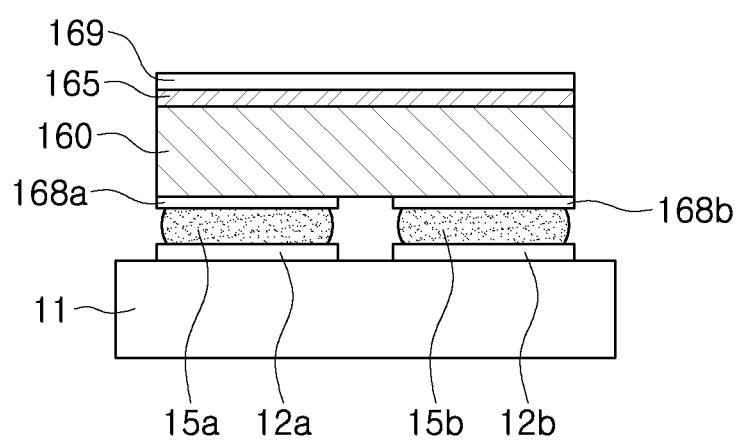
FIG. 15 is a side cross-sectional view illustrating a semiconductor light emitting device according to an exemplary embodiment.

FIG. 15 is a side cross-sectional view illustrating a semiconductor light emitting device according to an exemplary embodiment.

Referring to FIG. 15, a semiconductor light emitting device 170 according to an exemplary embodiment includes a wiring board having a mounting surface and a semiconductor LED chip 160 mounted on the mounting surface of the wiring board 11.

A semiconductor LED chip 160 may be mounted such that a first surface thereof faces the mounting surface, and first and second electrodes 168a and 168b may be connected to the first and second wiring electrodes 12a and 12b via the solder balls 15a and 15b, respectively.

The semiconductor LED chip 160 may have the first surface on which the first and second electrodes 168a and 168b are mounted, a second surface positioned to oppose the first surface, and side surfaces positioned between the first and second surfaces.

As illustrated in FIG. 15, in the present exemplary embodiment, a wavelength conversion layer 165 and a light distribution adjustment layer 169 may be sequentially disposed on the second surface of the semiconductor LED chip 160. In the present exemplary embodiment, in a case in which a DBR layer having wavelength selectivity is formed as the light distribution adjustment layer 169, it may be designed based on a wavelength of light converted by the wavelength conversion layer 165.

The wavelength conversion layer 165 includes a wavelength conversion material for converting a portion of light emitted from the semiconductor LED chip 160 into light having a different wavelength. The wavelength conversion layer 165 may be a resin layer in which the wavelength conversion material is dispersed, or a ceramic film formed of a sintered body of a ceramic phosphor. The semiconductor LED chip 160 emits blue light, and the wavelength conversion layer 165 may convert a portion of the blue light into yellow and/or red and green light, thereby providing the semiconductor light emitting device 170 emitting white light. Wavelength conversion materials that may be used in the present exemplary embodiment will be described hereinafter (refer to Table 3 below).

In this manner, since the reflective layer able to adjust light distribution at a chip level is introduced to replace the entirety or a portion of the function of an optical structure such as a lens, light distribution may be effectively adjusted, and when the reflective layer is eventually applied to a product, an additional optical structure may be omitted.

In the semiconductor light emitting device according to the present exemplary embodiment, light having a desired color may be determined according to a wavelength of an LED chip, a type of a phosphor, and a mixture ratio, and in the case of white light, color temperature and color rendering may be adjusted. In this manner, the wavelength conversion layer used in the present exemplary embodiment may be manufactured.

For example, in a case in which an LED chip emits blue light, a light emitting device package including at least one of yellow, green, and red phosphors may emit white light having various color temperatures according to mixing ratios of phosphors. On the other hand, a light emitting device package in which a green or red phosphor is applied to a blue LED chip may emit green or red light. In this manner, color temperature or a color rendering index (CRI) of white light may be adjusted by combining a light emitting device package emitting white light and a light emitting device package emitting green or red light. Also, a light emitting device package may be configured to include at least one of light emitting devices emitting purple, blue, green, red, or infrared light.

In this case, the lighting device may control the CRI to range from the level of light emitted by a sodium lamp to the level of sunlight, and may control a color temperature ranging from 1500 K to 20000 K to generate various levels of white light. In an exemplary embodiment, the lighting device may generate visible light having purple, blue, green, red, orange, or infrared light to adjust an illumination color according to a surrounding atmosphere or mood. Also, the lighting device may generate light having a special wavelength stimulating plant growth.

Figure 16:
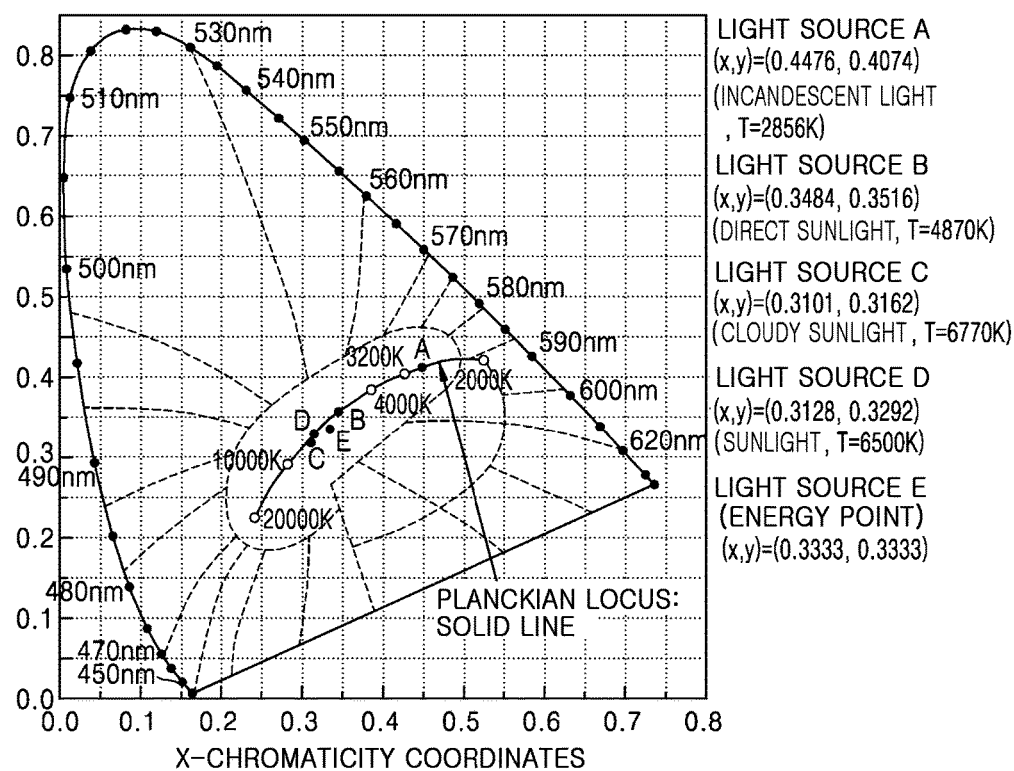
FIG. 16 is a CIE 1931 color space chromaticity diagram illustrating a wavelength conversion material employable in various exemplary embodiments.

White light generated by combining yellow, green, and red phosphors and a blue light emitting device and/or by combining green and red light emitting devices may have two or more peak wavelengths, and, as illustrated in FIG. 16, (x, y) coordinates may be positioned in a line connecting (0.4476, 0.4074), (0.3484, 0.3516), (0.3101, 0.3162), (0.3128, 0.3292), (0.3333, 0.3333) of the CIE 1931 chromaticity diagram. Alternatively, the (x, y) coordinates may be positioned in a region surrounded by the above line and a spectrum of black body radiation. A color temperature of white light corresponds to a range from about 1500 K to about 20000 K.

Various materials such as phosphors and/or quantum dots may be used as materials for converting a wavelength of light emitted from the semiconductor LED.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$)- Equation (1)

In Equation (1), Ln may be at least one type of element selected from the group consisting of Group Ma elements and rare earth elements, and M may be at least one type of element selected from the group consisting of calcium (Ca), barium (Ba), strontium (Sr), and magnesium (Mg).

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$.

Phosphor compositions should basically conform with stoichiometry, and respective elements may be substituted with different elements of respective groups of the periodic table. For example, strontium (Sr) may be substituted with barium (Ba), calcium (Ca), magnesium (Mg), and the like, of alkaline earth metals, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

In particular, to enhance reliability at high temperatures and high humidity, the fluoride-based red phosphor may be coated with a fluoride not containing manganese (Mn), or may further include an organic substance coated on a surface of the fluoride coating not containing manganese (Mn). Unlike any other phosphor, the fluoride-based red phosphor may realize a narrow full width at half maximum (FWHM) equal to or less than 40 nm, and thus, it may be utilized in high resolution TVs such as ultra high definition (UHD) TVs.

Table 3 below illustrates types of phosphors that may be applied in application fields in white light emitting devices using a blue LED chip having a dominant wavelength of 440 nm to 460 nm, or a ultraviolet (UV) LED chip having a dominant wavelength of 380 nm to 440 nm.

TABLE 3

| Purpose | Phosphor |
| --- | --- |
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$), K$_2$TiF$_6$:$Mn^{4+}$, NaYF$_4$:$Mn^{4+}$, NaGdF$_4$:$Mn^{4+}$ |
| Lighting | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \leq x \leq 3$, $0 < z < 0.3$, $0 < y \leq 4$), K$_2$TiF$_6$:$Mn^{4+}$, NaYF$_4$:$Mn^{4+}$, NaGdF$_4$:$Mn^{4+}$ |

TABLE 3-continued

| Purpose | Phosphor |
| --- | --- |
| Side Viewing (Mobile Devices, Laptop PCs) | $Lu_3Al_5O_{12}:Ce^{3+}$, $Ca$-$\alpha$-$SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $(Sr, Ba, Ca, Mg)_2SiO_4:Eu^{2+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6:Mn^{4+}$, $NaYF_4:Mn^{4+}$, $NaGdF_4:Mn^{4+}$ |
| Electrical Components (Headlamps, etc.) | $Lu_3Al_5O_{12}:Ce^{3+}$, $Ca$-$\alpha$-$SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}$ $(Eu_zM_{1-z})_xSi_{12-y}Al_yO_{3+x+y}N_{18-x-y}(0.5 \leq x \leq 3, 0 < z < 0.3, 0 < y \leq 4)$, $K_2TiF_6:Mn^{4+}$, $NaYF_4:Mn^{4+}$, $NaGdF_4:Mn^{4+}$ |

The wavelength conversion layer may include wavelength conversion materials such as quantum dots (QD) provided to be used in the place of phosphors or mixed with phosphors.

Figure 17:
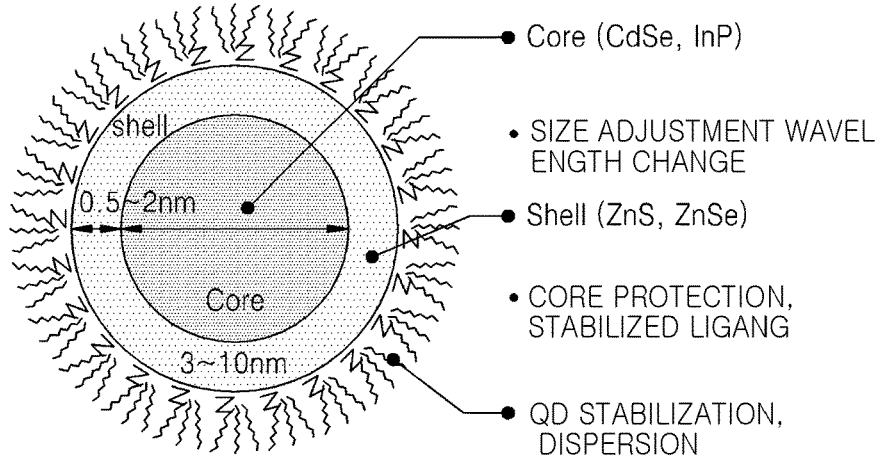
FIG. 17 is a view illustrating a cross-sectional structure of a quantum dot that may be used as a wavelength conversion material in various exemplary embodiments.

FIG. 17 is a view illustrating a cross-sectional structure of a quantum dot that may be used as a wavelength conversion material in the present disclosure. A quantum dot (QD) may have a core-shell structure including Group III-V or Group II-VI compound semiconductors. For example, the quantum dot may have a core such as CdSe or InP, or a shell such as ZnS or ZnSe. Also, the quantum dot may include a ligand to stabilize the core and shell. For example, the core may have a diameter ranging from 1 nm to 30 nm, and preferably, 3 nm to 10 nm. The shell may have a thickness ranging from 0.1 nm to 20 nm, and preferably, 0.5 to 2 nm.

The quantum dot may realize various colors according to sizes, and, in particular, when the quantum dot is used as a phosphor substitute, it may be used as a red or green phosphor. The use of a quantum dot may realize a narrow FWHM (e.g., about 35 nm).

It is illustrated that the wavelength conversion material is directly applied to the semiconductor LED chip, but, depending on an embodiment, a wavelength conversion material may be attached to another optical structure at a position spaced apart from a light source to be used. For example, when the wavelength conversion material is applied to a display device or a lighting device, the wavelength conversion material may be applied to a surface of a light guide plate or a diffusion plate.

Figure 18:
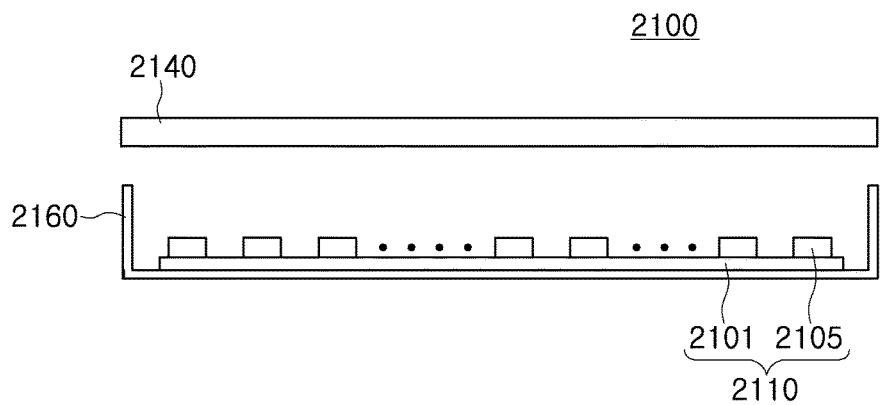
FIG. 18 is a cross-sectional view illustrating a backlight unit according to an exemplary embodiment.
Figure 19:
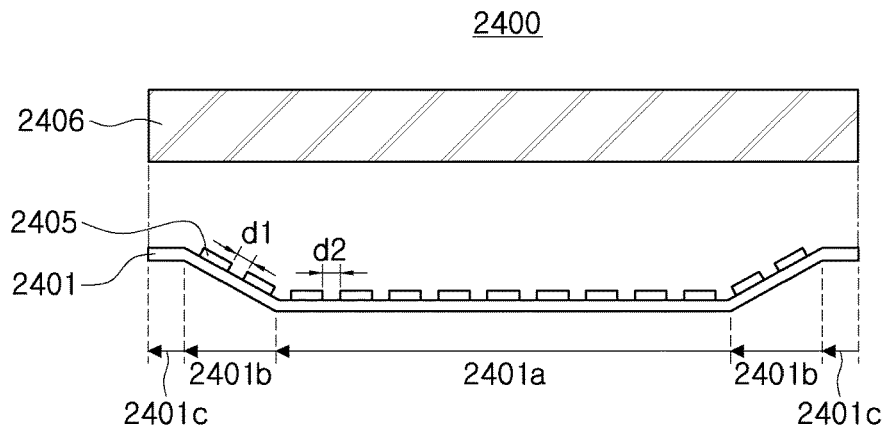
FIG. 19 is a cross-sectional view illustrating a backlight unit according to an exemplary embodiment.

FIGS. 18 and 19 are cross-sectional views illustrating backlight units according to various exemplary embodiments.

Referring to FIG. 18, a backlight unit 2100 may include a light diffuser 2140 and a light source module 2110 arranged below the light diffuser 2140. Also, the backlight unit 2100 may further include a bottom case 2160 disposed below the light diffuser 2140 and accommodating the light source module 2110. The backlight unit 2100 according to an exemplary embodiment may be a direct type backlight unit.

The light source module 2110 may include a PCB 2101 and a plurality of light sources 2105 mounted on an upper surface of the PCB 2101. The light source used herein may be the semiconductor light emitting device according to the exemplary embodiments described above. Alternatively, the light source module 2110 may have a chip-on-board structure. In this case, the light source module 2110 itself may be understood as a semiconductor light emitting device. In this case, the light source 2105 may be a semiconductor LED chip, and the PCB 2101 may be the wiring board of the semiconductor light emitting device.

FIG. 19 is a cross-sectional view illustrating a backlight unit according to another exemplary embodiment;

Referring to FIG. 19, a backlight unit 2400 includes at least one light source 2405 mounted on a circuit board 2401 and at least one optical sheet 2406 disposed thereabove.

The light source 2405 may be the light emitting device or the semiconductor LED chip according to the exemplary embodiments. The circuit board 2401 according to an exemplary embodiment may have a first planar portion 2401a corresponding to a main region, a sloped portion 2401b disposed around the first planar portion 2401a and bent in at least a portion thereto, and a second planar portion 2401c disposed on an edge of the circuit board 2501, namely, an outer side of the sloped portion 2401b. The light sources 2405 are arranged at a first interval d1 on the first planar portion 2401a, and one or more light sources 2405 may be arranged at a second interval d2 on the sloped portion 2401b. The first interval d1 may be equal to the second interval d2. A width of the sloped portion 2401b (or a length in the cross-section) may be smaller than that of the first planar portion 2401a, and may be larger than a width of the second planar portion 2401c. Also, depending on an embodiment, at least one light source 2405 may be arranged on the second planar portion 2401c.

A slope of the sloped portion 2401b may be appropriately adjusted within a range from 0 to 90 degrees with respect to the first planar portion 2401a, and with this structure, the circuit board 2401 may maintain substantially uniform brightness even in the vicinity of the edge of the optical sheet 2406.

Figure 20:
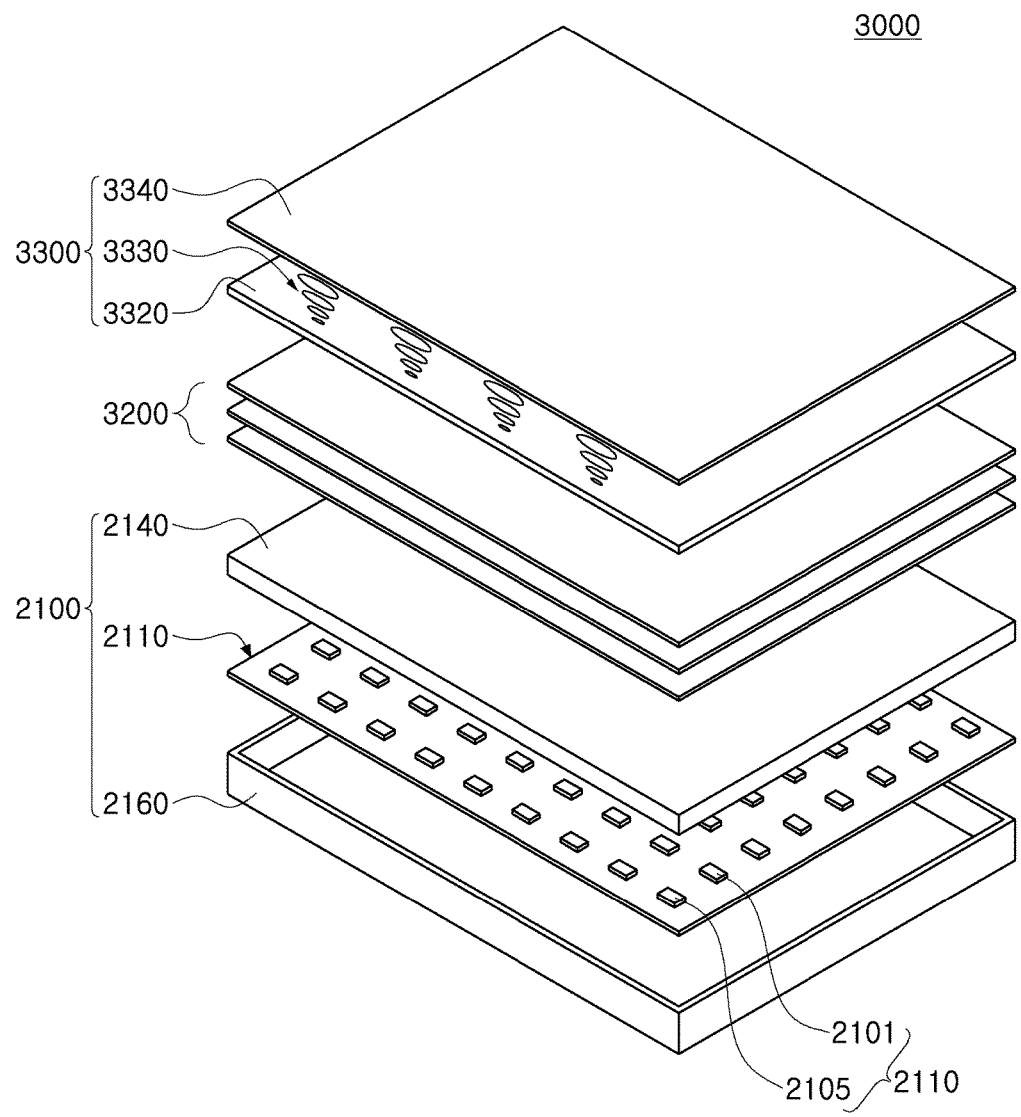
FIG. 20 is an exploded perspective view illustrating a display device employing the backlight unit illustrated in FIG. 18.

FIG. 20 is an exploded perspective view schematically illustrating a display device including the backlight unit illustrated in FIG. 18.

Referring to FIG. 20, a display apparatus 3000 may include a backlight unit 2100, an optical sheet 3200, and an image display panel 3300 such as a liquid crystal panel.

The backlight unit 2100 may include a bottom case 2160, a light guide plate 2140, and a light source module 2110 provided below the light guide plate 2140. The light source module 2110 may include a PCB 2101 and light sources 2105. The light sources 2110 used herein may be the semiconductor light emitting device or the semiconductor LED chip according to the exemplary embodiments.

The optical sheet 3200 may be disposed between the light guide plate 2140 and the image display panel 3300, and may include various types of sheets such as a diffusion sheet, a prism sheet, and a protective sheet.

The image display panel 3300 may display an image using light emitted from the optical sheet 3200. The image display panel 3300 may include an array substrate 3320, a liquid crystal layer 3330, and a color filter substrate 3340. The array substrate 3320 may include pixel electrodes disposed in a matrix form, thin film transistors (TFTs) applying a driving voltage to the pixel electrodes, and signal lines operating the TFTs. The color filter substrate 3340 may include a transparent substrate, a color filter, and a common electrode. The color filter may include filters selectively allowing light having a particular wavelength, included in white light emitted from the backlight unit 2100, to pass therethrough. The liquid crystal layer 3330 is rearranged by an electric field interposed between the pixel electrodes and the common electrode to adjust light transmittance. Light adjusted in transmittance may pass through the color filter of the color filter substrate 3340, thus displaying an image. The image display panel 3300 may further include a driving circuit unit processing an image signal, or the like.

Figure 21:
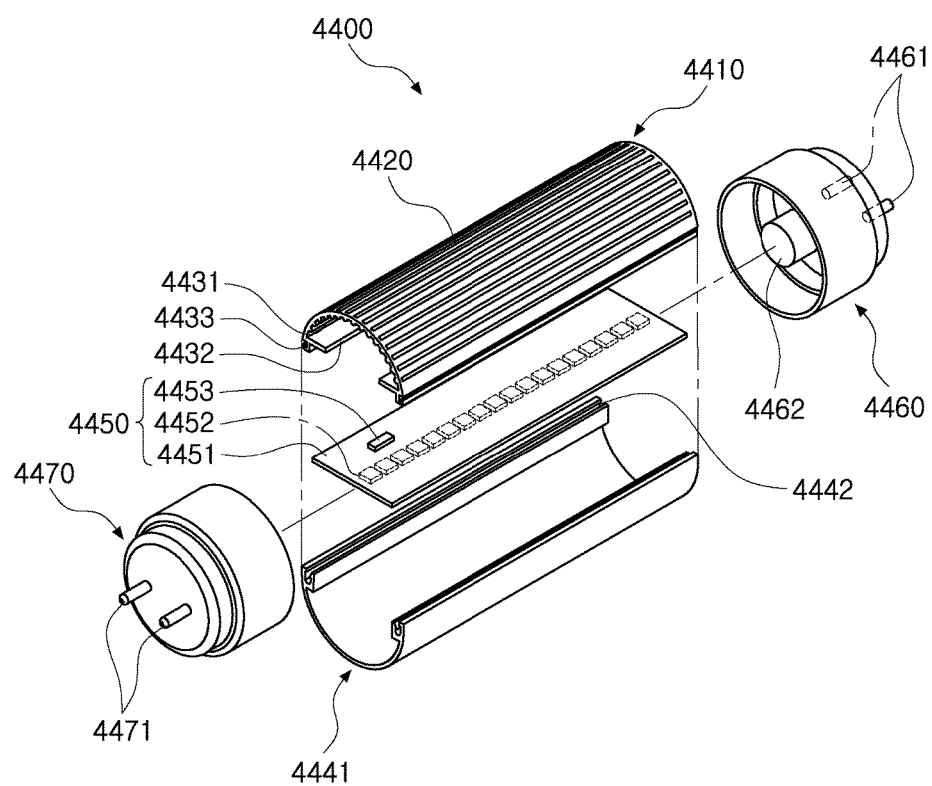
FIG. 21 is an exploded perspective view illustrating a lighting device according to an exemplary embodiment.

FIG. 21 is an exploded perspective view illustrating a tube type lamp as a lighting device according to an exemplary embodiment.

Referring to FIG. 21, a lighting device 4400 includes a heat dissipation member 4410, a cover 4441, a light source module 4450, a first socket 4460, and a second socket 4470. A plurality of heat dissipation fins 4420 and 4431 may be formed in a concavo-convex pattern on an internal and/or external surface of the heat dissipation member 4410, and the heat dissipation fins 4420 and 4431 may be designed to have various shapes and intervals (or spaces) therebetween. A support 4432 having a protruding shape is formed on an inner side of the heat dissipation member 4410. The light source module 4450 may be fixed to the support 4432. Stoppage protrusions 4433 may be formed at both ends of the heat dissipation member 4410.

Stoppage recesses 4442 may be formed in the cover 4441, and the stoppage protrusions 4433 of the heat dissipation member 4410 may be coupled to the stoppage recesses 4442 in a hook coupling manner. The positions of the stoppage recesses 4442 and the stoppage protrusions 4433 may be interchanged.

The light source module 4450 may include a light emitting device array. The light source module 4450 may include a PCB 4451, a light source 4452, and a controller 44553. As described above, the controller 4453 may store driving information of the light source 4452. Circuit wirings are formed on the PCB 4451 to operate the light source 4452. Also, components for operating the light source 4452 may be provided on the PCB 4451. Here, the light source 4452 may be the semiconductor light emitting device or the semiconductor LED chip according to the exemplary embodiments.

The first and second sockets 4460 and 4470, a pair of sockets, are coupled to both ends of the cylindrical cover unit including the heat dissipation member 4410 and the cover 4441. For example, the first socket 4460 may include electrode terminals 4461 and a power source device 4462, and dummy terminals 4471 may be disposed on the second socket 4470. Also, an optical sensor and/or a communications module may be installed in at least one of the first socket 4460 or the second socket 4470. For example, the optical sensor and/or the communications module may be installed in the second socket 4470 in which the dummy terminals 4471 are disposed. In another example, the optical sensor and/or the communications module may be installed in the first socket 4460 in which the electrode terminals 4461 are disposed.

As set forth above, according to exemplary embodiments, since a reflective layer is introduced as a light distribution adjustment layer to a main light emitting surface of the semiconductor LED chip, light closer to be perpendicular to the light emitting surface may be suppressed, and light closer to the side surfaces of the semiconductor LED chip may be relatively increased. In this manner, light distribution of the semiconductor LED chip may be adjusted without using any other structure such as a lens.

While exemplary embodiments have been shown and described above, it will be apparent to those skilled in the art that modifications and variations could be made without departing from the scope of the invention as defined by the appended claims.

What is claimed is:

1. A semiconductor light emitting device comprising:
   a wiring board comprising a mounting surface on which a first wiring electrode and a second wiring electrode are disposed;
   a semiconductor light emitting diode (LED) chip comprising a first surface on which a first electrode and a second electrode are disposed, the first surface facing the mounting surface, the semiconductor LED chip further comprising a second surface positioned opposite to the first surface, and side surfaces positioned between the first surface and the second surface, the first electrode and the second electrode being connected to the first wiring electrode and the second wiring electrode, respectively; and
   a reflective layer disposed on the second surface and the side surfaces of the semiconductor LED chip,
   wherein transmissivity of light emitted from the semiconductor LED chip and passing through the reflective layer is greater at a second incident angle than at a first incident angle, the second incident angle being greater than the first incident angle.

2. The semiconductor light emitting device of claim 1, wherein the reflective layer comprises a distributed Bragg reflector (DBR) layer.

3. The semiconductor light emitting device of claim 2, wherein
   the reflective layer is disposed on at least the second surface of the semiconductor LED chip, and
   an amount of light emitted from the DBR layer in a first region, which is defined based on a first rotation angle around a central axis, the central axis being perpendicular to the second surface of the semiconductor LED chip, is greater than the amount of light emitted from the DBR layer in a second region, which is defined based on a second rotation angle around the central axis, the second rotation angle being smaller than the first rotation angle.

4. The semiconductor light emitting device of claim 3, wherein the first rotation angle ranges from about 30° to about 50°, and the second rotation angle ranges from about 70° to about 90°.

5. The semiconductor light emitting device of claim 3, further comprising a lateral reflective portion disposed on the wiring board such that the lateral reflective portion surrounds the side surfaces of the semiconductor LED chip, the lateral reflective portion comprising a reflective material.

6. The semiconductor light emitting device of claim 5, wherein the reflective layer comprises a metal.

7. The semiconductor light emitting device of claim 5, wherein the reflective layer comprises at least one hole through which light is emitted from the semiconductor LED chip toward an outside of the semiconductor light emitting device.

8. The semiconductor light emitting device of claim 5, wherein the semiconductor LED chip comprises a light-transmissive substrate, a first conductivity-type semiconductor layer, an active layer, and a second conductivity-type semiconductor layer, the first conductivity-type semiconductor layer, the active layer, and the second conductivity-type semiconductor layer being sequentially stacked on the light-transmissive substrate, and the second surface of the semiconductor LED chip is provided by the light-transmissive substrate.

9. A semiconductor light emitting device comprising:
a wiring board comprising a mounting surface on which a first wiring electrode and a second wiring electrode are disposed;
a semiconductor light emitting diode (LED) chip comprising a first surface on which a first electrode and a second electrode are disposed, the first surface facing the mounting surface, the semiconductor LED chip further comprising a second surface positioned opposite to the first surface, and side surfaces positioned between the first surface and the second surface, the first electrode and the second electrode being connected to the first wiring electrode and the second wiring electrode, respectively; and
a light distribution adjustment layer disposed on the second surface and the side surfaces of the semiconductor LED chip,
wherein transmissivity of light emitted from the semiconductor LED chip and passing through the light distribution adjustment layer is greater at a second incident angle than at a first incident angle, the second incident angle being greater than the first incident angle.

10. The semiconductor light emitting device of claim 9, wherein the light distribution adjustment layer has a structure in which dielectric films having different refractive indices are alternately stacked a plurality of times.

11. The semiconductor light emitting device of claim 9, further comprising a wavelength conversion layer disposed between the light distribution adjustment layer and the semiconductor LED chip and configured to convert at least a portion of light emitted from the semiconductor LED chip into light having a different wavelength.

12. A semiconductor light emitting diode (LED) chip comprising a first surface on which a first electrode and a second electrode are disposed, a second surface positioned opposite to the first surface, and side surfaces positioned between the first surface and the second surface, the semiconductor LED chip further comprising:
a light distribution adjustment layer disposed on the second surface and the side surfaces of the semiconductor LED chip, wherein transmissivity of light emitted from the semiconductor LED chip and passing through the light distribution adjustment layer is greater at a second incident angle than at a first incident angle, the second incident angle being greater than the first incident angle.

13. A display device comprising:
an image display panel configured to display an image;
a backlight unit disposed below the image display panel and comprising the semiconductor light emitting device of claim 5; and
a light guide plate configured to guide light emitted from the backlight unit toward the image display panel.

14. A semiconductor light emitting device comprising:
a wiring board;
a semiconductor light emitting diode (LED) chip mounted on the wiring board and configured to emit light, the semiconductor LED chip comprising a first surface on which the semiconductor LED chip is mounted on the wiring board, a second surface positioned opposite to the first surface, and side surfaces positioned between the first surface and the second surface, respectively; and
a light distribution adjustment layer disposed on the second surface and the side surfaces the semiconductor LED chip, wherein transmissivity of light, which is emitted from the semiconductor LED chip and passes through the light distribution adjustment layer, is adjusted according to an incident angle of the light on the light distribution adjustment layer,
wherein the transmissivity of light emitted from the semiconductor LED chip and passing through the light distribution adjustment layer is greater at a second incident angle than at a first incident angle, the second incident angle being greater than the first incident angle.

15. The semiconductor light emitting device of claim 14, wherein the transmissivity of the light is adjusted such that, with respect to the light distribution adjustment layer, transmissivity of the light traveling in a vertical direction is lowered and transmissivity of the light traveling in a lateral direction is increased.

16. The semiconductor light emitting device of claim 14, wherein the light distribution adjustment layer has a structure in which dielectric films having different refractive indices are alternately stacked a plurality of times, and the transmissivity of the light is further adjusted according to at least one of the refractive indices, thicknesses, and a number of stacking of the dielectric films included in the light distribution adjustment layer.

17. The semiconductor light emitting device of claim 14, wherein the light distribution adjustment layer comprises at least one of a distributed Bragg reflector (DBR) layer and a metal reflective layer.

* * * * *